US012642026B2

(12) United States Patent
Guo et al.

(10) Patent No.: US 12,642,026 B2
(45) Date of Patent: May 26, 2026

(54) NITROGEN-CONTAINING AROMATIC OR RING STRUCTURE MOLECULES FOR PLASMA ETCH AND DEPOSITION

(71) Applicant: American Air Liquide, Inc., Fremont, CA (US)

(72) Inventors: Xiangyu Guo, Bear, DE (US); Nathan Stafford, Bear, DE (US); Scott Biltek, Bear, DE (US)

(73) Assignee: American Air Liquide, Inc., Newark, DE (US)

( * ) Notice: Subject to any disclaimer, the term of this patent is extended or adjusted under 35 U.S.C. 154(b) by 524 days.

(21) Appl. No.: 18/091,528

(22) Filed: Dec. 30, 2022

(65) Prior Publication Data

US 2024/0242971 A1 Jul. 18, 2024

(51) Int. Cl.
*H01L 21/311* (2006.01)
*H01L 21/3205* (2006.01)
(Continued)

(52) U.S. Cl.
CPC ............ *H10P 50/283* (2026.01); *H10P 14/40* (2026.01); *H10P 50/267* (2026.01); *H10P 50/71* (2026.01); *H10P 50/73* (2026.01)

(58) Field of Classification Search
None
See application file for complete search history.

(56) References Cited

U.S. PATENT DOCUMENTS 5,242,538 A 9/1993 Hamrah et al.
5,814,563 A 9/1998 Ding et al.
(Continued)

FOREIGN PATENT DOCUMENTS

WO WO 2009/019219 12/2009
WO WO 2021/158433 8/2021

OTHER PUBLICATIONS

Shimmura, et al., Electrical Conductivity of Sidewall-Deposited Fluorocarbon Polymer in SiO2 Etching Process, Journal of Vacuum Science & Technology B 20(6), Nov./Dec. 2002, pp. 2346-2350; doi: 10.1116/1.1520551.
(Continued)

*Primary Examiner* — Duy Vu N Deo
*Assistant Examiner* — Andrew Keelan Laobak
(74) *Attorney, Agent, or Firm* — Yan Jiang

(57) ABSTRACT

A method for forming a substantially vertical structure comprises: exposing a substrate to a vapor of an additive comprising a nitrogen-containing cyclic compound, the substrate having a film disposed thereon and a patterned mask layer disposed on the film, activating a plasma to produce an activated nitrogen-containing cyclic compound, and allowing an etching reaction to proceed between the film uncovered by the patterned mask layer and the activated nitrogen-containing cyclic compound to selectively etch the film from the patterned mask layer, thereby forming the substantially vertical structure, wherein the nitrogen-containing cyclic compound reduces a charge that builds up along sidewalls of the substantially vertical structure forming a conductive sidewall passivation layer on the sidewalls thereof. A method of depositing a conductive polymer layer on a substrate and a cyclic method are also disclosed.

10 Claims, 6 Drawing Sheets

(51) Int. Cl.

| | |
|---|---|
| ***H01L 21/3213*** | (2006.01) |
| ***H10P 14/40*** | (2026.01) |
| ***H10P 50/00*** | (2026.01) |
| ***H10P 50/26*** | (2026.01) |
| ***H10P 50/28*** | (2026.01) |

(56) References Cited

U.S. PATENT DOCUMENTS

| | | | |
|---|---|---|---|
| 5,843,847 | A | 12/1998 | Pu et al. |
| 6,387,287 | B1 | 5/2002 | Hung et al. |
| 6,508,948 | B2 | 1/2003 | Felker et al. |
| 7,344,975 | B2 | 3/2008 | Sandhu et al. |
| 7,846,846 | B2 | 12/2010 | Bera et al. |
| 9,543,158 | B2 | 1/2017 | Hudson et al. |
| 9,659,788 | B2 | 5/2017 | Surla et al. |
| 10,141,878 | B2 | 11/2018 | Suzuki et al. |
| 10,347,498 | B2 | 7/2019 | Hsu et al. |
| 2003/0162395 | A1 | 8/2003 | Trapp et al. |
| 2006/0062914 | A1 | 3/2006 | Garg et al. |
| 2009/0032963 | A1 | 2/2009 | Tran |
| 2009/0277382 | A1 | 11/2009 | Mizuno et al. |
| 2014/0199851 | A1 | 7/2014 | Nemani et al. |
| 2014/0252589 | A1 | 9/2014 | Griffin et al. |
| 2015/0294880 | A1 | 10/2015 | Anderson et al. |
| 2018/0211845 | A1* | 7/2018 | Hsu ..................... H01L 21/3081 |

OTHER PUBLICATIONS

Khandelwal, et al., Dry removal technology for advanced CMOS devices, Nanochip Tech. J., vol. 11, Issue 2, 2013, pp. 17-19.

Ohtake, H., et al., Prediction of abnormal etching profile in high-aspect-ratio via/hole etching using on-wafer monitoring system, Japanese Journal of Applied Physics 49 (2010) 04DB14-1 (5 pgs.).

Clark, D.T. et al., Plasma polymerization. V. A systematic investigation of the inductively coupled RF plasma polymerization of the isomeric tetrafluorobenzenes, Polymer Science: Polymer Chemistry Edition, vol. 19, pp. 2689-2703, 1981.

Shin, C.H. et al., SiO2 etching characteristics of perfluoro-2-butene (I-C4F8) and hexafluoropropene (I-C3F6), Environmentally Benign Etching Technology Laboratory Association of Super-Advanced Electronics Technologies 3-1 Morinosato Wakamiya, Atsugi-shi, 243-0198 Japan, 2 pgs.

Ito, T. et al., Hydrogen Effects in Hydrofluorocarbon plasma etching of silicon nitride: beam study with Cf+, CF2+, and CH2F+ ions, J. Vac. Sci. Technol. A 29, 050601 (2011) 050601 (4 pgs.).

Manos, D.M. and D.L. Flamm, editors, Plasma etching: an introduction, Plasmas, Materials interactions, Academic Press, Inc., San Diego, CA, 1989, 12-13.

* cited by examiner

NITROGEN-CONTAINING AROMATIC OR RING STRUCTURE MOLECULES FOR PLASMA ETCH AND DEPOSITION

FIELD

The present invention is related to etching and deposition methods using nitrogen-containing aromatic or ring structure molecules for high aspect ratio (HAR) plasma etch forming a substantial vertical structure with a highly conductive sidewall passivation layer deposited thereon, and for deposition applications of forming a highly conductive layer on a planar and/or a patterned substrate.

BACKGROUND

HAR etching process has become a key process for manufacturing memory devices. Ion energy control by increasing an effective bias power for HAR features continues to advance. Great efforts were made to increase ion energies to overcome charge build-up on an etching front inside HAR holes. Based on the trend of bias power in the past few years, the required power has exceeded 20 KW. Many challenges arise when the bias power is increased. Arcing prevention, effective cooling, and power delivery systems are all critical for enabling high-power capability. Moreover, it is harder to compensate for neutral fluxes with increasing aspect ratio, because the neutral species are transferred only by diffusion through the HAR holes.

Plasma etching, especially in HAR structures is a complex process that has not entirely understood. The chemistry of the plasma is composed of ions and neutrals. The neutrals as fragments from the etching chemistries injected into the plasma play a complex part in the formation of reactive species and polymer species. The reactive species may react with the substrate materials as well as other species in the plasma. Neutral species flux through the holes of the etched structure is complex as their reactivity and propensity to form polymer along with their sticking coefficients can impact their transport to different depths. A C:F ratio for the etching chemistry is a basic idea that imparts some ideas about the species that result in the plasma that is not predictive.

Vertical isotropy of etched features is obtained by ion transport during plasma sheath formation. In principle, positive and negative particles should have the same trajectories inside a HAR hole and equalize the charge at the bottom of the HAR hole. However, due to electron shading effect, charge builds up at the bottom of HAR mask patterns, which can lead to incomplete etching, bowing, twisting, and critical dimension (CD) variation between the top and bottom of the HAR hole. Therefore, lots of efforts were made by industry and are continuing to get rid of or minimize the sidewall charge-up during HAR etching, to improve the etch profile and CD control.

U.S. Pat. No. 7,344,975B2 disclose a method of HAR contact etching that is a substantially vertical contact hole in an oxide layer using a hard photo resist mask. Plasma etch gases are hydrocarbon fluoride comprises one of $CH_2F_2$, $C_4F_8$, $C_3H_3F_5$, $C_4F_8$, $CHF_3$, $C_2F_6$, $C_2HF_5$, $CH_3F$, or combinations thereof. Dopant molecule comprises one of HI, $CH_3I$, carbon, potassium, calcium, $PF_6$, $BF_3$, chloride, $AsF_6$ or combinations thereof.

US 007846846B2 discloses HAR contact openings are etched while preventing bowing or bending of the etch profile by forming a highly conductive thin film on the sidewall of each contact openings. Fluorocarbon/fluorohydrocarbon etching gas comprises at least one of $C_2F_4$, $C_4F_6$, $CH_2F_2$ or $C_4F_8$.

U.S. Pat. No. 9,543,158B2 discloses various embodiments relate to methods and systems for forming a recessed feature in dielectric material on a substrate. Separate etching and deposition operations are employed in a cyclic manner. The etch chemistry is a combination of fluorocarbons and oxygen, $C_4F_6$, $C_4F_3$, $N_2$, CO, $CF_4$, and $O_2$. The reactants include $[(CH_3)_2CHO]_3B$, $B(CD_3)_3$, $(C_6H_5)_3B$, $(C_6F_5)_3B$, $BCl_3$, $BH_3$, $B_2H_6$, $BF_3$, $B(OCH_3)_3$, a silane, a halosilane or an aminosilane, such as, $SiH_4$, $Si_2H_6$, methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like.

US20060062914A1 discloses apparatus and processes for treating at least a portion of the surface of a substrate. The chemistry of surface treatments includes $C_3F_3N_3$ only for etching only. No pattern etch discloses.

U.S. Pat. No. 6,508,948$B_2$ discloses a method for etching features into a substrate by removing substrate material from selected areas while leaving the substrate substantially unaffected in other areas. The disclosed molecules are $C_5F_5N$ (CAS No.: 700-16-3), $C_3F_4N_2$ (CAS No.: 478693-81-1), $C_4N_2F_4$ (CAS No.: 13177-77-0), $C_4N_2F_4$ (CAS No.: 767-79-3), $C_3F_3N_3$ (CAS No.: 675-14-9), $C_4NF_5$ (CAS No.: 445235-48-3), $C_3F_4N_2$ (CAS No.: 478693-82-2), $C_4N_2F_4$ (CAS No.: 7627-80-7), $C_3F_2N_3Cl$ (CAS No.: 696-85-5), $C_3FN_3Cl_2$ (CAS No.: 696-84-4), and $C_3N_3Cl_3$ (CAS No.: 108-77-0). All of the listed molecules are $C_xF_yN_z$ aromatic structures, which do not include any specific hydrogen-containing molecules. They disclose the molecule may be hydrocarbons. Only formula mentioned is $C_3Cl_xF_{3-x}N_3$ (where x=0, 1, 2, 3 and mixtures thereof). So that where x=0, the molecule is $C_3F_3N_3$.

U.S. Pat. No. 5,814,563 discloses methods for etching dielectric using etchant gas composition comprises (i) fluorohydrocarbon gas selected from the group consisting of $CH_3F$, $CHF_3$, $C_2HF_5$, $C_2H_2F_2$, and $C_2H_4F_2$, and more preferably $CHF_3$; and (ii) fluorocarbon gas selected from the group consisting of $CF_4$, $C_2F_6$, $C_3F_8$, $C_4F_8$, and $C_4F_{10}$, and more preferably $CF_4$. The $NH_3$-generating gas comprise $NH_3$, $NH_4OH$, $CH_3NH_2$, $C_2H_5NH_2$, $C_3H_8NH_2$, and mixtures thereof, of which $NH_3$ is preferred. The use of NH type gases as additives to fluorocarbon etch process is disclosed. The carbon-oxygen gas comprise CO, $CO_2$, HCOOH, HCOH, $CH_3COOH$, $CH_3OH$, and mixtures thereof, of which CO is preferred.

U.S. Pat. No. 9,659,788 to Surla et al. discloses nitrogen-containing compounds for etching semiconductor structures. Molecules disclosed may contain one or more C═N and CEN, but ring and aromatic structures and conductivity of the polymers are not disclosed. Comparative data was disclosed for $C_5F_5N$. Disclosed is $C_3HF_4N$ which can make polymer that contains C, F, N, and O. The compositional percentage of each element is not disclosed but shows nitrogen is present in the polymer films. Surla et al. disclose that nitrogen may act as a better sidewall passivation layer and helps create vertical profiles during high aspect ratio etching.

U.S. Pat. No. 10,410,878 discloses hydrofluorocarbons containing —$NH_2$ functional group for 3D NAND and DRAM applications U.S. Pat. No. 10,347,498 discloses methods of minimizing plasma-induced sidewall damage during low-k etch processes using (N≡C—)—(R)—(—C≡N), $R_x$[—C═N ($R_z$)]$_y$ and $R_{(3-a)}$—N—$H_a$.

U.S. Pat. No. 7,153,779$B_2$ discloses method to eliminate striations and surface roughness caused by dry etch, in which nitrogen-comprising gases used include $N_2O$, $NH_3$, $N_2H_4RNH_2$ where R is a $C_1$-$C_3$ hydrocarbon or fluorohydrocarbon, and mixtures thereof, with $NH_3$ preferred.

US 2014/0199851 discloses a plasma process performed by flowing NF and NH to remove the modified portion of silicon nitride layer to pattern a silicon nitride dielectric film.

U.S. Pat. No. 5,242,538 discloses using CF and NH etching gases and selectivity of silicon oxide to polysilicon selectivity of up to 100:1.

U.S. Pat. No. 5,843,847 discloses adding additional nitrogen gas to fluorinated etching gas to assist in feature dimensional control.

US 2006/0062914 discloses an activated reactive gas to treat the surface of a substrate by the activated reactive gas including a large variety of fluorine-containing gases, including $C_3F_3N_3$, fluoroamines such as $NH_2F$, fluoronitriles such as CFN, and CFNO.

WO2009019219 discloses methods using environmentally advantageous compounds or compositions, for example, fluoro ethers, fluoroalkanes, fluoroalkanes, fluoroketones, nitrogen-, sulfur- and phosphorous substituted fluorides, for applications such as foam blowing, solvent cleaning, and refrigeration, as etching gas for semiconductor etching or chamber cleaning, heat transfer, fire extinguishing and production of aerosols, and to specific azeotropes which can be applied in at least one of these processes.

Khandelwal, et al. ("Dry removal technology for advanced CMOS devices", Nanochip Tech. J., vol. 11, issue 2, 2013, p 17-19) disclose an in-situ dry removal process using NHF as etchant.

Traditional etch gases include octafluorocyclobutane ($cC_4F_8$), hexafluoro-1,3-butadiene ($C_4F_6$), $CF_4$, $CH_2F_2$, $CH_3F$, and/or $CHF_3$. It is well known that selectivity and polymer deposition rate increase as the ratio of C:F increases (i.e., $C_4F_6$>$C_4F_8$>$CF_4$). See, e.g., U.S. Pat. No. 6,387,287 to Hung et al. However, for very high aspect ratio etching applications, for example >20:1 for applications such as 3DNAND or DRAM they may not have sufficient performance. The —$C_xF_y$ polymers on sidewalls may be susceptible to etching through ion bombardment and F* reaction with the Si material.

As a result, the etched patterns may not be vertical and the etch structures may show bowing, change in dimensions, pattern collapse and/or increased roughness.

Bowing may result from sidewall etching of the mask layer, which may often be an amorphous carbon (a-C) material. The a-C materials may be etched by oxygen radicals in the plasma which may cause increased opening of the mask and result in bow-like, or angled/curved, etch structures.

C:F polymers are by their nature very electrically insulating materials. The source of the carbon in the C:F polymer is a combination of the C:F containing etching gas along with the carbon mask material itself. As such as they passivate the sidewall of the pattern structure and result in an electric charge buildup during the etching process due to the plasma electrons impinging on the sidewall due to their random thermal motion resulting in localized electric fields. This electric charge buildup will cause a deflection of the trajectory of the ions as they travel down the etched hole and contribute to bowing and other phenomena such as twisting and etch stop. This phenomena is described in many references including US 2014/0252589. For example, H. Ohtake etc, (*Japanese Journal of Applied Physics* 49 (2010)) explains that the charge-up potential in $SiO_2$ trench sidewall with an AR of ~15 varies from 0.1 MV/cm to 0.3 MV/cm, depending on the sidewall conductivity.

One method to reduce the sidewall charging is to modify the conductivity of the polymer that is deposited. For example U.S. Pat. No. 7,344,975$B_2$ teaches a method of doping the polymer with doping additives such as carbon, potassium, calcium, $PF_6$, $BF_3$, chloride, $AsF_6$ or combinations thereof. While this may create hard-to-clean species, such as the metal compounds, in the etch chamber and cause issues with the following steps.

US 2015294880 teaches that C:F ratio of the etching gas does not directly correspond to the C:F ratio in the deposited polymer. For example molecules with the same chemical formula but different structures can result in polymers with different C:F ratio, different deposition rates, different fragments as measured by mass spectrometry, and different etch rates and selectivites to a variety of materials ($SiO_2$, a-C, photoresist, SiN).

Clark et al. (Polymer Science: Polymer Chemistry Edition, Vol. 19, 2689-2703, 1981) teach that isomers of $C_6H_2F_4$ creates polymers of different C:F stoichiometries deposited by plasma.

Shin et al. ("$SiO_2$ Etching Characteristics of Perfluoro-2-butene (I—$C_4F_8$) and Hexafluoropropene (I—$C_3F_6$)", Environmentally Benign Etching Technology Laboratory Association of Super-advanced Electronics Technologies 3-1 Morinosato Wakamiya, Atsugi-shi, 243-0198 JAPAN) compared the etching properties of two isomers of $C_4F_8$ and found that etching rate of $SiO_2$ and selectivity against materials such as PR, SiN and Si are different and thus associated to the structure of the etching gas and not just the C:F ratio.

Shimmura et al. (Journal of Vacuum Science & Technology B 20, 2346 (2002)) teaches that 2 molecules with the same C:F ratio ($C_2F_4$ and $C_4F_8$) have remarkably different polymer conductivity and polymer composition due to the structural differences in the molecules, especially —C═C— vs —C—C— bonding. They postulate that depositing a polymer on the sidewall utilizing a chemistry that can form —C═C— structure may improve the conductivity of the film and therefore help reduce sidewall charge buildup.

Ito et al. (J. Vac. Sci. Technol. A 29, 050601 (2011) teaches that the H can both etch SiN by forming what may be volatile HCN but the H can also scavenge fluorine atoms from the deposited film. This is complicated by the fact that different H species from the fragmentation of the molecule can behave quite differently to etch and passivation.

Therefore, both chemical structure and the chemical formula may impact the actual polymer that is deposited which will affect how that polymer behaves in the etching process in terms of its conductivity properties as well as its resistance to etch species and ion bombardment.

Conductive polymers may also be needed for applications outside etching and deposition methods for semiconductor manufacturing processes such as manufacturing of chemical sensors, electro-magnetic shielding, antistatic coatings, corrosion inhibitors, compact electronic devices such as polymer-based transitions, light-emitted diode (LEDs), and lasers, microwave-absorbent coating particularly radar-absorptive coatings on stealth aircraft, and biomedical applications.

Thus, there is a need for new etching molecules that can produce conductive sidewall polymers to improve the etching performance for high aspect ratio structures.

SUMMARY

There is disclosed a method for forming a substantially vertical structure, the method comprising:

- exposing a substrate to a vapor of an additive comprising a nitrogen-containing cyclic compound, the substrate having a film disposed thereon and a patterned mask layer disposed on the film;
- activating a plasma to produce an activated nitrogen-containing cyclic compound; and
- allowing an etching reaction to proceed between the film uncovered by the patterned mask layer and the activated nitrogen-containing cyclic compound to selectively etch the film from the patterned mask layer, thereby forming the substantially vertical structure,
- wherein the nitrogen-containing cyclic compound reduces a charge that builds up along sidewalls of the substantially vertical structure forming a conductive sidewall passivation layer on the sidewalls thereof. The disclosed method for forming a substantially vertical structure may include one or more of the following features:
  - further comprising, prior to activating the plasma, sequentially or simultaneously exposing the substrate to one or more hydrofluorocarbon or fluorocarbon etching gases with the additive;
  - the one or more hydrofluorocarbon or fluorocarbon etching gases being selected from $C_4F_6$, $C_4F_8$, $C_4H_2F_6$, $CHF_3$, $CH_2F_2$, $CH_3F$, $CF_4$, $C_2F_6$, $C_3F_8$, $SF_6$, $NF_3$, $C_2F_4$, $C_3F_6$, $C_4F_{10}$, $C_5F_8$, $C_6F_6$, $C_1$-$C_6$ $C_xF_y$ molecule (x and y are integers), $C_2H_5F$, $C_3H_7F$, $C_3H_2F_6$, $C_2HF_5$, or combination thereof;
  - the one or more hydrofluorocarbon or fluorocarbon etching gases being selected from HBr, HCl, HI, HF, or $H_2$;
  - further comprising, prior to activating the plasma, sequentially or simultaneously exposing the substrate to an inert gas with the additive;
  - the inert gas is selected from Ar, Kr, Xe, Ne, $N_2$, He or combination thereof;
  - further comprising, prior to activating the plasma, sequentially or simultaneously exposing the substrate to a co-reactant with the additive;
  - the co-reactant is selected from $O_2$, CO, $CO_2$, NO, $NO_2$, $N_2O$, $SO_2$, $H_2S$, or COS or combinations thereof;
  - the nitrogen-containing cyclic compound containing a cyclic or aromatic structure, at least 1 double C═C bond and at least one nitrogen contained within the cyclic or aromatic structure;
  - the nitrogen-containing cyclic compound having a general formula $C_xH_yX_zX'_aN_b$, where x=3-6; y=0-4; z=0-8; a=0-1; b=1-3; X=F, Cl, Br or I (halogens), X'=F, Cl, Br, I (halogens) or CN group, where X≠X', provided that the nitrogen-containing cyclic compound excludes $C_5F_5N$ (CAS No.: 700-16-3), $C_3F_4N_2$ (CAS No.: 478693-81-1), $C_4N_2F_4$ (CAS No.: 13177-77-0), $C_4N_2F_4$ (CAS No.: 767-79-3), $C_3F_3N_3$ (CAS No.: 675-14-9), $C_4NF_5$ (CAS No.: 445235-48-3), $C_3F_4N_2$ (CAS No.: 478693-82-2), $C_4N_2F_4$ (CAS No.: 7627-80-7), $C_3F_2N_3Cl$ (CAS No.: 696-85-5), $C_3FN_3Cl_2$ (CAS No.: 696-84-4), and $C_3N_3Cl_3$ (CAS No.: 108-77-0);
  - the nitrogen-containing cyclic compound being exclusive of $C_5F_5N$ (CAS No.: 700-16-3), $C_3F_4N_2$ (CAS No.: 478693-81-1), $C_4N_2F_4$ (CAS No.: 13177-77-0), $C_4N_2F_4$ (CAS No.: 767-79-3), $C_3F_3N_3$ (CAS No.: 675-14-9), $C_4NF_5$ (CAS No.: 445235-48-3), $C_3F_4N_2$ (CAS No.: 478693-82-2), $C_4N_2F_4$ (CAS No.: 7627-80-7), $C_3F_2N_3Cl$ (CAS No.: 696-85-5), $C_3FN_3Cl_2$ (CAS No.: 696-84-4), and $C_3N_3Cl_3$ (CAS No.: 108-77-0);
  - the disclosed etching and deposition chemistry used as the additive or the main etching gas comprising cyclic or aromatic nitrogen-containing ring molecules having the formula: $C_xH_yF_zI_aN_b$, or $C_xH_yI_zN_b$, or $C_xH_yCl_zN_b$, where x=3-6; y=0-4; z=0-8; a=0-1; b=1-3. For example, when z=0, the disclosed etching and deposition chemistry used as the additive or the main etching gas includes pyridine ($C_5H_5N$);
  - the nitrogen-containing cyclic compound being selected from $C_5HF_4N$ (CAS No.: 2875-18-5), $C_5F_5N$ (CAS No.: 700-16-3), $C_3F_3N_3$ (CAS No.: 675-14-9), $C_3F_3N_3$ (CAS No.: 112291-51-7), $C_3F_3N_3$ (CAS No.: 75995-67-4), $C_4F_4N_2$ (CAS No.: 13177-77-0), $C_4F_4N_2$ (CAS No.: 7627-80-7), $C_4F_4N_2$ (CAS No.: 767-79-3), $C_6F_9N_3$ (CAS No.: 368-66-1), $C_5H_2F_3N$ (CAS No.: 3512-18-3), $C_5H_2F_3N$ (CAS No.: 67815-54-7), $C_5H_2F_3N$ (CAS No.: 76469-41-5), $C_5H_2F_3N$ (CAS No.: 837365-04-5), $C_3HF_2N_3$ (CAS No.: 1207861-13-9), $C_3HF_2N_3$ (CAS No.: 919785-60-7), $C_3H_2FN_3$ (CAS No.: 96100-45-7), $C_5F_7N_3$ (CAS No.: 714-56-7), $C_5F_7N_3$ (CAS No.: 717-62-4), $C_4F_5N_3$ (CAS No.: 368-55-8), $C_5H_4NI$ (CAS No.: 5029-67-4), $C_5H_4NI$ (CAS No.: 1120-90-7), $C_5H_4NI$ (CAS No.: 15854-87-2), $C_3F_4N_2$ (CAS No.: 478693-82-2), $C_3F_4N_2$ (CAS No.: 478693-82-1), $C_3F_4N_2$ (CAS No.: 442872-78-8), $C_4NF_5$ (CAS No.: 445235-48-3), $C_5H_4FN$ (CAS No.: 372-47-4), $C_3Cl_3N_3$ (CAS No.: 108-77-0), $C_5HCl_4N$ (CAS No.: 2402-79-1), $C_5H_4ClN$ (CAS No.: 626-60-8), $C_5H_5N$ (CAS No.: 110-86-1), $C_4H_4N_2$ (CAS No.: 289-95-2), $C_4H_4N_2$ (CAS No.: 290-37-9), $C_3H_3N_3$ (CAS No.: 290-87-9), $C_6F_7N$ (CAS No.: 3244-44-8), $C_6F_7N$ (CAS No.: 3146-94-9), $C_6F_7N$ (CAS No.: 440367-82-8), $C_5F_6N_2$ (CAS No.: 27077-33-4), $C_5F_6N_2$ (CAS No.: 27077-34-5), $C_5F_6N_2$ (CAS No.: 27077-35-6), $C_5F_6N_2$ (CAS No.: 442872-68-6), $C_6F_8N_2$ (CAS No.: 49616-39-9), $C_6F_8N_2$ (CAS No.: 67096-98-4), $C_6F_8N_2$ (CAS No.: 57684-66-9), $C_6F_8N_2$ (CAS No.: 55827-93-5), $C_6F_8N_2$ (CAS No.: 54415-66-6), $C_6F_8N_2$ (CAS No.: 54415-65-5), $C_5H_3F_2N$ (CAS No.: 1513-65-1), $C_5H_3F_2N$ (CAS No.: 84476-99-3), $C_5H_3F_2N$ (CAS No.: 71902-33-5), $C_5H_3F_2N$ (CAS No.: 1513-66-2), $C_5H_3F_2N$ (CAS No.: 34941-90-7), $C_5H_3F_2N$ (CAS No.: 82878-63-5), $C_4HF_3N_2$ (CAS No.: 696-82-2), $C_4HF_3N_2$ (CAS No.: 17573-78-3), $C_4HF_3N_2$ (CAS No.: 17573-79-4), $C_4HF_3N_2$ (CAS No.: 55215-60-6), $C_4HF_3N_2$ (CAS No.: 103526-69-8), $C_4HF_3N_2$ (CAS No.: 2386912-84-9), $C_4H_3FN_2$ (CAS No.: 675-21-8), $C_4H_3FN_2$ (CAS No.: 31575-35-6), $C_4H_3FN_2$ (CAS No.: 4949-13-7), $C_4H_3FN_2$ (CAS No.: 31462-55-2), $C_4H_3FN_2$ (CAS No.: 157496-33-8), $C_4H_3FN_2$ (CAS No.: 157496-32-7), $C_4H_2FN_3$ (CAS No.: 2169434-14-2), or $C_4H_2FN_3$ (CAS No.: 2116289-91-7);
  - the nitrogen-containing cyclic compound is $C_5HF_4N$ (CAS No.: 2875-18-5);

the substantially vertical structure being an aperture, via, hole, or trench formed in the film;

an aspect ratio of the substantially vertical structure ranging between approximately 1:1 and approximately 500:1;

the conductive sidewall passivation layer containing at least C, F, and N;

a nitrogen content contained in the conductive sidewall passivation layer is greater than 2.5%;

the pressure in the reactor being held between approximately 1 mTorr and approximately 100 Torr; and the substrate temperature in the reactor ranging between approximately −110° C. to approximately 2000° C.

Also, disclosed is a method of depositing a conductive polymer layer on a substrate, the method comprising:

a) exposing the substrate to a vapor of an additive comprising a nitrogen-containing cyclic compound;

b) activating a plasma to produce an activated nitrogen-containing cyclic compound; and c) forming the conductive polymer layer on the substrate by depositing at least part of the nitrogen-containing cyclic compound thereon, wherein the nitrogen-containing cyclic compound reduces a charge that builds up along the substrate forming the conductive polymer passivation layer thereon, wherein a nitrogen content contained in the conductive polymer layer is greater than 2.5%. The disclosed method for forming a substantially vertical structure may include one or more of the following features:

the nitrogen-containing cyclic compound having a general formula $C_xH_yX_zX'_aN_b$, where x=3-6; y=0-4; z=0-8; a=0-1; b=1-3; X=F, Cl, Br or I (halogens), X'=F, Cl, Br or I (halogens), where X≠X';

the nitrogen-containing cyclic compound being $C_5HF_4N$ (CAS No.: 2875-18-5);

the fluorocarbons/hydrofluorocarbon etching gas being selected from $C_4F_6$, $C_4F_8$, $C_4H_2F_6$, $CHF_3$, $CH_2F_2$, $CH_3F$, $CF_4$, $C_2F_6$, $C_3F_8$, $SF_6$, $NF_3$, $C_2F_4$, $C_3F_6$, $C_4F_{10}$, $C_5F_8$, $C_6F_6$, $C_1$-$C_6$ $C_xF_y$ molecules (x and y are integers), $C_2H_5F$, $C_3H_7F$, $C_3H_2F_6$, $C_2HF_5$, or combination thereof;

the etching gas being HBr, HCl, HI, HF, or $H_2$;

further comprising sequentially or simultaneously exposing the substrate to an oxidizer with the additive at step a) wherein the oxidizer is selected from $O_2$, CO, $CO_2$, NO, $NO_2$, $N_2O$, $SO_2$, $H_2S$, or COS or combinations thereof; and the desired depth of the etched structure formed in the film having an aspect ratio between approximately 1:1 and approximately 500:1.

Also, disclosed is a cyclic method of forming a structure, the structure being formed in a film disposed on a substrate and a patterned mask layer disposed on the film, the method comprising a) exposing a substrate to a vapor of an additive comprising a nitrogen-containing cyclic compound;

b) activating a plasma to produce an activated nitrogen-containing cyclic compound;

c) forming a conductive polymer layer on the substrate by depositing at least part of the nitrogen-containing cyclic compound thereon, wherein the nitrogen-containing cyclic compound reduces a charge that builds up along the substrate forming the conductive polymer layer thereon;

d) performing a purging process with an inert gas;

e) exposing the substrate to an etching gas selected from the nitrogen-containing cyclic compound, a hydrofluorocarbon, hydrocarbon, HBr, HCl, HI, HF, $H_2$, or combinations thereof;

f) activating a plasma to produce an activated etching gas;

g) allowing an etching reaction to proceed between the activated etching gas and the film uncovered by the patterned mask layer and the conductive polymer layer to selectively etch the film and the conductive polymer layer from the patterned mask layer, h) performing another purging process with the inert gas;

i) repeating steps a) to h), until a desired depth of the structure in the film is formed. performing another purging process with the inert gas; and j) repeating steps a) to h), until a desired depth of the structure is formed. The disclosed method for forming a substantially vertical structure may include one or more of the following features:

a nitrogen content contained in the conductive polymer layer being greater than 2.5%;

the nitrogen-containing cyclic compound having a general formula $C_xH_yX_zX'_aN_b$, where x=3-6; y=0-4; z=0-8; a=0-1; b=1-3; X=F, Cl, Br or I (halogens), X'=F, Cl, Br or I (halogens), where X≠X';

the nitrogen-containing cyclic compound being $C_5HF_4N$ (CAS No.: 2875-18-5);

the desired depth of the etched structure formed in the film having an aspect ratio between approximately 1:1 and approximately 500:1.

further comprising sequentially or simultaneously exposing the substrate to an oxidizer with the additive at step a), wherein the oxidizer is selected from $O_2$, CO, $CO_2$, NO, $NO_2$, $N_2O$, $SO_2$, $H_2S$, or COS or combinations thereof; and further comprising sequentially or simultaneously exposing the substrate to an inert gas with the etching gas at step e), wherein the inert gas is selected from Ar, Kr, Xe, Ne, $N_2$, He or combination thereof.

Notation and Nomenclature

The following detailed description and claims utilize a number of abbreviations, symbols, and terms, which are generally well known in the art, and include:

As used herein, the indefinite article "a" or "an" means one or more.

As used herein, "about" or "around" or "approximately" in the text or in a claim means ±10% of the value stated.

As used herein, "room temperature" in the text or in a claim means from approximately 20° C. to approximately 25° C.

The term "substrate" refers to a material or materials on which a process is conducted. The substrate may refer to a wafer having a material or materials on which a process is conducted. The substrates may be any suitable wafer used in semiconductor, photovoltaic, flat panel, or LCD-TFT device manufacturing. The substrate may also have one or more layers of differing materials already deposited upon it from a previous manufacturing step. For example, the wafers may include silicon layers (including, but not limited to, crystalline, amorphous, porous, etc.), Si-containing layers (including, but not limited to, $SiO_2$, SiN, SiON, SiCOH, etc.), metal or metal containing layers (including, but not limited to, copper, cobalt, ruthenium, tungsten, platinum, palladium, nickel, ruthenium, gold, etc.) or combinations thereof. Furthermore, the substrate may be planar or patterned. The substrate may be an organic patterned Iodinated carbon layer film. The substrate may include layers of oxides which are used as dielectric materials in field effect transistor (FET) such as FinFET, MOFSET, GAAFET(Gate all-around FET), Ribbon-FET, Nanosheet, Forksheet FET, Complementary FET (CFET), MEMS, 3D NAND, MIM, DRAM, or FeRam device applications (for example, $ZrO_2$ based materials, $HfO_2$ based materials, $TiO_2$ based materials, rare earth oxide based materials, ternary oxide based materials, etc.) or nitride-based films (for example, TaN, TIN, NbN) that are used as electrodes. One of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates. The substrate may be any solid that has functional groups on its surface that are prone to react with the reactive head of a SAM, and may include without limitation 3D objects or powders.

The term "processing" as used herein includes patterning, exposure, development, etching, cleaning, and/or removal of the material as required in forming a described structure.

The term "wafer" or "patterned wafer" refers to a wafer having a stack of films on a substrate and at least the top-most film having topographic features that have been created for pattern etch.

The term "pattern etch" or "patterned etch" refers to etching a non-planar structure, such as a stack of silicon-containing films below a patterned hardmask layer.

As used herein, the term "etch" or "etching" means to use an etching compound and/or a plasma to remove material via ion bombardment, remote plasma, or chemical vapor reaction between the etching gas and substrate and refers to an isotropic etching process and/or an anisotropic etching process. The isotropic etch process involves a chemical reaction between the etching compound and the substrate resulting in part of material on the substrate being removed. This type of etching process includes chemical dry etching, vapor phase chemical etching, thermal dry etching, or the like. The isotropic etch process produces a lateral or horizontal etch profile in a substrate. The isotropic etch process produces recesses or horizontal recesses on a sidewall of a pre-formed aperture in a substrate. The anisotropic etch process involves a plasma etching process (i.e., a dry etch process) in which ion bombardment accelerates the chemical reaction in the vertical direction so that vertical sidewalls are formed along the edges of the masked features at right angles to the substrate (Manos and Flamm, Thermal etching an Introduction, Academic Press, Inc. 1989 pp. 12-13). The plasma etching process produces a vertical etch profile in a substrate. The plasma etching process produces vertical vias, apertures, trenches, channel holes, gate trenches, staircase contacts, capacitor holes, contact holes, slit etch, self-aligned contact, self-aligned vias, super vias etc., in the substrate.

Note that herein, the terms "etching compound", "etchant", "etching gas" and "process gas" may be used interchangeably when the etching compound is in a gaseous state under room temperature and ambient pressure. It is understood that an etching compound may correspond to, or related to an etching gas or an etchant or a process gas, and that the etching gas or the etchant or the process gas may refer to the etching compound.

The term "mask" refers to a layer that resists etching. The mask layer may be located above the layer to be etched. The mask layer also refers to a hardmask layer. The mask layer may be an amorphous carbon (a-C) layer, a doped a-C layer, a photoresist layer, an anti-reflective layer, an organic planarization layer, and combinations thereof. The mask layer may also be a silicon layer, such as poly-Si, metal oxide such as Ti, Al, Zr, Hf, etc. oxide, and combinations thereof.

The term "aspect ratio" refers to a ratio of the height of a trench (or aperture) to the width of the trench (or the diameter of the aperture).

The term "high aspect ratio (HAR)" refers to an aspect ratio ranging from approximately 1:1 to approximately 500:1, preferably from approximately 20:1 to approximately 400:1.

The term "etch stop" refers to a layer below the layer to be etched that protects layers underneath.

The term "device channel" refers to layers that are part of actual device and any damage to it will affect device performance.

The term "selectivity" means the ratio of the etch rate of one material to the etch rate of another material. The term "selective etch" or "selectively etch" means to etch one material more than another material, or in other words to have a greater or less than 1:1 etch selectivity between two materials.

The term "low bias power" or "reduced bias power" refers to a bias power lower than a baseline process.

The term "additive" used herein refers to a compound or gas that is added to other etching compounds and provides some improving characteristics of the etch such as improving the profile characteristics, such as bowing, CD, ellipticity, etc.

The term "ellipticity" used herein refers to a method to measure mask degradation, where in an etch application, the ellipticity of the etched hole was estimated by (the short hole width/the long hole width)*100% for simplicity; therefore, the ellipticity of the complete circular shape was defined as 100%.

As used herein, the abbreviation "NAND" refers to a "Negated AND" or "Not AND" gate; the abbreviation "2D" refers to 2 dimensional gate structures on a planar substrate; the abbreviation "3D" refers to 3 dimensional or vertical gate structures, wherein the gate structures are stacked in the vertical direction.

The term "conductivity" used herein is the reciprocal of electrical resistivity and represents the material's ability to conduct electric current. The unit of electrical conductivity used herein is Siemens per centimeter (S/cm). It is measured using a mercury probe and calculated from the current-voltage curve under the electrical field of 0.2 MV/cm using the solution of $$\sigma = \frac{I * T}{V * A},$$

where σ is conductivity, I is current measured by mercury probe; T is thickness of the polymer; A is the contact area of the mercury probe. Electrical field is defined as applied voltage divided by polymer thickness. For example, in FIG. 4, when the electrical field is 0.2 MV/cm, the measured current is $1.92\times10^{-11}$ Amp. The conductivity of $C_4F_8$ polymer is calculated as $2.14\times10^{-9}$ S/cm.

The term "high conductive sidewall passivation layer" used herein refers to an electrical conductivity of the sidewall passivation layer above the conductivity of $C_4F_8$ polymer, which is calculated as $2.14\times10^{-9}$ S/cm.

Note that herein, the terms "film" and "layer" may be used interchangeably. It is understood that a film may correspond to, or related to a layer, and that the layer may refer to the film. Furthermore, one of ordinary skill in the art will recognize that the terms "film" or "layer" used herein refer to a thickness of some material laid on or spread over a surface and that the surface may range from as large as the entire wafer to as small as a trench or a line.

Note that herein, the terms "aperture", "via", "hole", "trench" and "structure" may be used interchangeably to refer to an opening formed in a semiconductor substrate.

As used herein, the abbreviation "TSV" refers to the process called through silicon via refers to the process of forming an electrical connection vertically through a silicon structure, primarily through a silicon wafer or silicon structure.

Note that herein, the term "cycle" or "cyclic" may refer to a process of repeating steps in the etching or deposition process. Such example could include alternating an etch and a deposition steps for a set number of times in a process such as a "Bosch" etch process or an Atomic Layer Etching (ALE) process.

Note that herein, the term "Bosch" etch process refers to a cyclic etching process of an alternating deposition and etching steps to form a vertical structure in a silicon structure (such as TSV process). The traditional method uses $C_4F_8$ as the deposition gas to deposit a $C_xF_y$ (x and y are integers) polymer and $SF_6$ as the etching gas.

Note that herein, the terms "dope" or "doping" is used intentionally to the process of incorporation of one or more elements into a film composition through various methods where those elements may be chemically bond or physically bond. The element may be doped interstitial or substitutional within the film.

Please note that the silicon-containing films, such as SiN and SiO, are listed throughout the specification and claims without reference to their proper stoichiometry. The silicon-containing films may include pure silicon (Si) layers, such as crystalline Si, poly-silicon (p-Si or polycrystalline Si), or amorphous silicon; silicon nitride ($Si_kN_l$) layers; or silicon oxide ($Si_nO_m$) layers; or mixtures thereof, wherein k, l, m, and n, inclusively range from 0.1 to 6. Preferably, silicon nitride is $Si_kN_l$, where k and l each range from 0.5 to 1.5. More preferably silicon nitride is $Si_3N_4$. Herein, SiN in the following description may be used to represent $Si_kN_l$ containing layers. Preferably silicon oxide is $Si_nO_m$, where n ranges from 0.5 to 1.5 and m ranges from 1.5 to 3.5. More preferably, silicon oxide is $SiO_2$. Herein, SiO in the following description may be used to represent $Si_nO_m$ containing layers. The silicon-containing film could also be a silicon oxide based dielectric material such as organic based or silicon oxide based low-k dielectric materials such as the Black Diamond II or III material by Applied Materials, Inc. with a formula of SiOCH. Silicon-containing film may also include $Si_aO_bN_c$ where a, b, c range from 0.1 to 6. The silicon-containing films may also include dopants, such as B, C, P, As, Ga, In, Sn, Sb, Bi and/or Ge, and combinations thereof.

The standard abbreviations of the elements from the periodic table of elements are used herein. It should be understood that elements may be referred to by these abbreviation (e.g., Si refers to silicon, N refers to nitrogen, O refers to oxygen, C refers to carbon, H refers to hydrogen, F refers to fluorine, etc.).

Note that herein, the terms "deposition temperature" and "substrate temperature" may be used interchangeably. It is understood that a substrate temperature may correspond to, or related to a deposition temperature, and that the deposition temperature may refer to the substrate temperature.

Note that herein, the terms "precursor" and "deposition compound" and "deposition gas" may be used interchangeably when the precursor is in a gaseous state at room temperature and ambient pressure. It is understood that a precursor may correspond to, or related to a deposition compound or deposition gas, and that the deposition compound or deposition gas may refer to the precursor.

The unique CAS registry numbers (i.e., "CAS") assigned by the Chemical Abstract Service are provided to identify the specific molecules disclosed.

Note that herein, the term "scalloping" or "scallop" refers to the inward etching of one layer when etching a multilayer stack or cyclic etch process. The scallops result in a rough sidewall. As the scallop sizes become larger, the sidewall surface becomes rougher.

As used herein, the term "hydrocarbon" refers to a saturated or unsaturated function group containing exclusively carbon and hydrogen atoms. As used herein, the term "alkyl group" refers to saturated functional groups containing exclusively carbon and hydrogen atoms. An alkyl group is one type of hydrocarbon. Further, the term "alkyl group" refers to linear, branched, or cyclic alkyl groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

Ranges may be expressed herein as from about one particular value, and/or to about another particular value. When such a range is expressed, it is to be understood that another embodiment is from the one particular value and/or to the other particular value, along with all combinations within said range. Any and all ranges recited herein are inclusive of their endpoints (i.e., x=1 to 4 or x ranges from 1 to 4 includes x=1, x=4, and x=any number in between), irrespective of whether the term "inclusively" is used.

Reference herein to "one embodiment" or "an embodiment" means that a particular feature, structure, or characteristic described in connection with the embodiment may be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used herein, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x(NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term “or” is intended to mean an inclusive “or” rather than an exclusive “or”. That is, unless specified otherwise, or clear from context, “X employs A or B” is intended to mean any of the natural inclusive permutations. That is, if X employs A; X employs B; or X employs both A and B, then “X employs A or B” is satisfied under any of the foregoing instances. In addition, the articles “a” and “an” as used in this application and the appended claims should generally be construed to mean “one or more” unless specified otherwise or clear from context to be directed to a singular form.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein.

DESCRIPTION OF PREFERRED EMBODIMENTS

Figure 1:
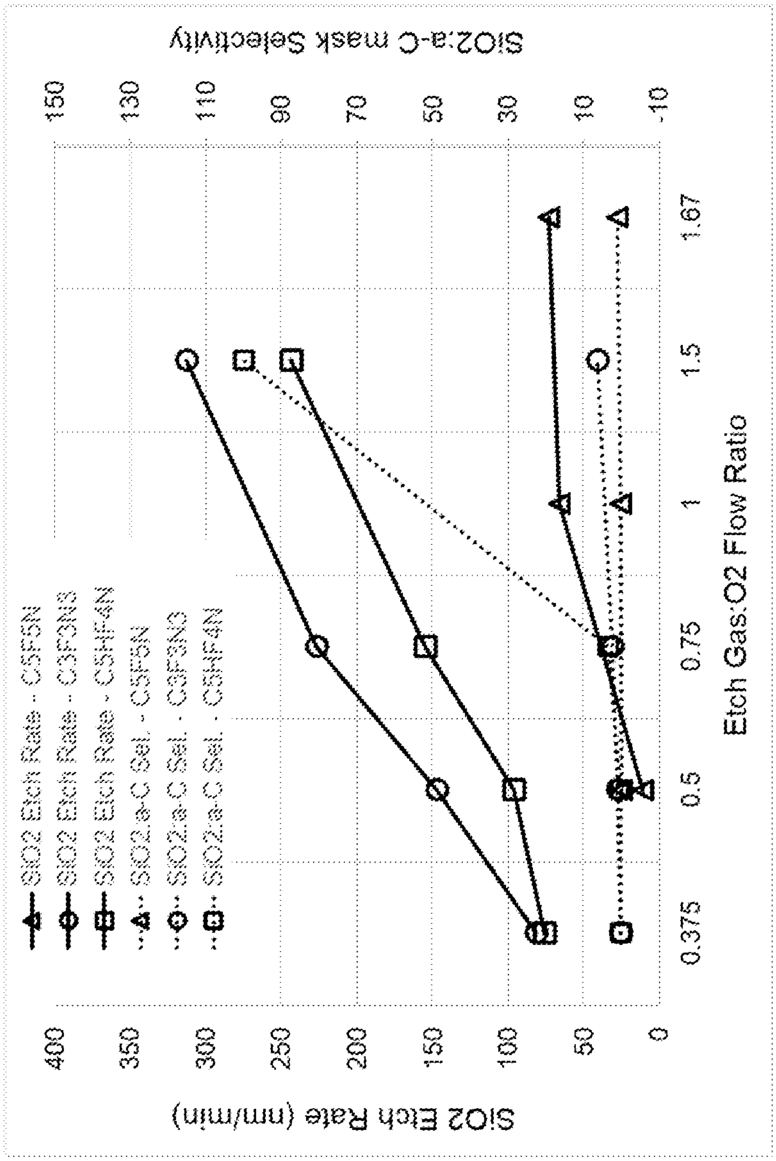
FIG. 1 shows $SiO_2$, SiN, p-Si, a-C etch rate and selectivity of $SiO_2$ to a-C mask of various etching gases.

Disclosed are etching methods of using an additive or an additive chemical or using the additive as a main etching gas to support the formation of a high conductive sidewall polymer passivation layer or a conductive layer on sidewalls of etched structures during HAR etch. The disclosed methods provide using a novel aromatic nitrogen-containing fluorocarbon and iodine-containing compound or etching gas or a new etching material as an additive or as a main etching gas during HAR etch to form the high conductive sidewall polymer passivation layer or the conductive layer. The conductive layer may be a polymer passivation layer. The conductive state of the generated polymer passivation layer reduces charge buildup along the sidewalls to prevent twisting of HAR holes or structures formed by bleeding off the charge and ensuring proper control of critical dimension (CD) variations at low bias power level or less to no bias power. In addition, the generated polymer passivation layer is easily to be cleaned with traditional cleaning processes such as, plasma cleaning methods such as using $O_2$ or $CF_4$ or wet cleaning methods using water, organic solvents, or acids such as HF, and will have no extra chamber contamination issues, since volatile byproducts are formed in plasma phase and may be pumped out of an etch chamber rapidly.

The disclosed novel aromatic nitrogen-containing fluorocarbon and iodine-containing compound or etching gas may also be considered as low bias energy etching gas, since with minimized sidewall charge, less plasma bias power is required for reactive ions to reach the bottom of HAR apertures. In addition, the novel aromatic nitrogen-containing fluorocarbons and iodine-containing compounds, additives or etching gases disclosed herein does not contain any hard-to-clean elements, which also minimize chamber contamination issues and reduce tool maintenance/down time. Furthermore, it has been found that the disclosed novel aromatic nitrogen-containing fluorocarbons and iodine-containing compounds, additives or etching gases create conductive polymers by themselves without a need of additional dopant additives. The conductivity of the generated polymer passivation layer is significantly increased as compared to traditional etching gases known in the art.

The disclosed are also deposition methods of using the disclosed additive or the additive chemical as a deposition precursor to deposit a conductive layer on a surface that may be planer or patterned in a substrate. The disclosed novel aromatic nitrogen-containing fluorocarbon and iodine-containing compound or a new etching material as an additive may be used as a main deposition precursor to form the conductive layer on a planar or a patterned surface in semiconductor applications.

The disclosed methods may be used in a deposition step and the disclosed aromatic nitrogen-containing fluorocarbon and iodine-containing compound used as additives may also be used as a deposition precursor in a cyclic or continuous deposition/etch process to deposit a conductive passivation layer on a surface such as in an ALE process or a TSV etching process, or in other applications for which a conductive polymer might be useful.

Regarding aromatic nitrogen-containing fluorocarbons and iodine-containing compounds, there are two key differences of having N inside the ring versus outside the ring. N inside the ring (vs C═N, NH, etc.) may be more stabilized to form larger fragments. Thus, preferably, the disclosed novel aromatic nitrogen-containing fluorocarbons and iodine-containing compound or etching gases or the new etching materials contain at least one nitrogen inside the ring or aromatic structure. The rings may open up and form polymer chains. We believe hydrogen on the ring itself may be a key advantage over a fully fluorinated structure. The C—H bond is likely to break and this is a known reactive site that may then polymerize. It has been known that hydrogen in the molecule is known to form more polymerizing structure. In some key applications such as etching nitride film it is advantageous to have hydrogen in the molecule. In addition, decreased F:C ratio may increase more cross-linked film, which result in higher selectivity to the mask. Moreover, both H and C═C increases selectivity to the mask and polymer deposition rate, but H may be more favorable with less polymer but improved selectivity. Ion energy may help break the deposition from a double bond molecule more easily than a hydrogen containing molecule, but double bond deposited protection of the mask may be less than the one with hydrogen.

The disclosed novel aromatic nitrogen-containing fluorocarbon and iodine-containing compound comprises cyclic or aromatic nitrogen-containing ring molecules having the formula: $C_xH_yX_zX'_aN_b$, where x=3-6; y=0-4; z=0-8; a=0-1; b=1-3; X=F, Cl, Br or I (halogens), X'=F, Cl, Br, I (halogens) or CN group, where X≠X'.

Alternatively, the disclosed novel aromatic nitrogen-containing fluorocarbon and iodine-containing compound comprises cyclic or aromatic nitrogen-containing ring molecules having the formula: $C_xH_yF_zI_aN_b$, or $C_xH_yI_zN_b$, or $C_xH_yCl_zN_b$, where x=3-6; y=0-4; z=0-8; a=0-1; b=1-3. For example, when z=0, the disclosed novel aromatic nitrogen-containing fluorocarbon and iodine-containing compound includes pyridine ($C_5H_5N$). More specifically, the disclosed novel aromatic nitrogen-containing fluorocarbon and iodine-containing compound excludes the following compounds: $C_5F_5N$ (CAS No.: 700-16-3), $C_3F_4N_2$ (CAS No.: 478693-81-1), $C_4N_2F_4$ (CAS No.: 13177-77-0), $C_4N_2F_4$ (CAS No.: 767-79-3), $C_3F_3N_3$ (CAS No.: 675-14-9), $C_4NF_5$ (CAS No.: 445235-48-3), $C_3F_4N_2$ (CAS No.: 478693-82-2), $C_4N_2F_4$ (CAS No.: 7627-80-7), $C_3F_2N_3Cl$ (CAS No.: 696-85-5), $C_3FN_3Cl_2$ (CAS No.: 696-84-4), and $C_3N_3Cl_3$ (CAS No.: 108-77-0) which are disclosed in U.S. Pat. No. 6,508,948B2.

The disclosed novel aromatic nitrogen-containing fluorocarbon and iodine-containing compound is a new etching and deposition material.

Disclosed etching and deposition composition for forming high conductive sidewall passivation layer during HAR etch may include the following components, each component may be contained one or more.

Etch gas such as fluorocarbon/fluorohydrocarbon selected from $C_4F_6$, $C_4F_8$, $C_4H_2F_6$, $CHF_3$, $CH_2F_2$, $CH_3F$, $CF_4$, $C_2F_6$, $C_3F_8$, $SF_6$, $NF_3$, $C_2F_4$, $C_3F_6$, $C_4F_{10}$, $C_5F_8$, $C_6F_6$, $C_1$-$C_6$ $C_xF_y$ molecules (x and y are integers), $C_2H_5F$, $C_3H_7F$, $C_3H_2F_6$, $C_2HF_5$, or combination thereof, or other etching gas such as HBr, HCl, HI, HF or $H_2$;

Co-reactant or oxidizer selected from $O_2$, CO, $CO_2$, NO, $NO_2$, $N_2O$, $SO_2$, $H_2S$, or COS;

Inert gas selected from Ar, Xe, Kr, Ne, He, $N_2$ or combinations thereof; and

New etching and deposition material used as an additive having a general formula of $C_xH_yX_zX'_aN_b$, where x=3-6; y=0-4; z=0-8; a=0-1; b=1-3; X=F, Cl, Br or I (halogens), X'=F, Cl, Br, I (halogens) or CN group, where X≠X', or $C_xH_yF_zI_aN_b$, or $C_xH_yI_zN_b$, or $C_xH_yCl_zN_b$, where x=3-6; y=0-4; z=0-8; a=0-1; b=1-3, wherein the new etching material contains at least 1 double C═C bonds, a cyclic or aromatic structure and at least one nitrogen that is contained within the cyclic or aromatic structure, wherein the new etching material excludes the following compounds: $C_5F_5N$ (CAS #700-16-3), $C_3F_4N_2$ (CAS #478693-81-1), $C_4N_2F_4$ (CAS #13177-77-0), $C_4N_2F_4$ (CAS #767-79-3), $C_3F_3N_3$ (CAS #675-14-9), $C_4NF_5$ (CAS #445235-48-3), $C_3F_4N_2$ (CAS #478693-82-2), $C_4N_2F_4$ (CAS #7627-80-7), $C_3F_2N_3Cl$ (CAS #696-85-5), $C_3FN_3Cl_2$ (CAS #696-84-4), and $C_3N_3Cl_3$ (CAS #108-77-0).

Some of the exemplary molecules of the disclosed novel aromatic nitrogen-containing fluorocarbon and iodine-containing compound or new etching and deposition material may be used as the additive with CAS No. and boiling points are shown in Table 1.

TABLE 1

| Mol. Structure | Mol. Formula | CAS No. | Boiling Point |
|---|---|---|---|
| 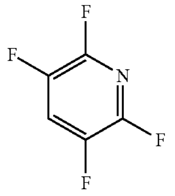 | $C_5HF_4N$ | 2875-18-5 | 102° C. |
| 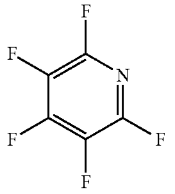 [SMILES: Fc1nc(F)c(F)c(F)c1F] | $C_5F_5N$ | 700-16-3 | 83-85° C. |
| 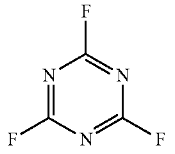 | $C_3F_3N_3$ | 675-14-9 | 73-74° C. |
| 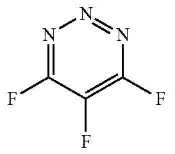 | $C_3F_3N_3$ | 112291-51-7 | |
| 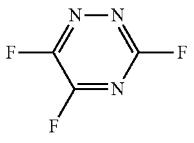 | $C_3F_3N_3$ | 75995-67-4 | |

TABLE 1-continued
| Mol. Structure | Mol. Formula | CAS No. | Boiling Point |
|---|---|---|---|
| 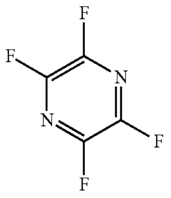 | $C_4F_4N_2$ | 13177-77-0 | 52-54° C. melting point |
| 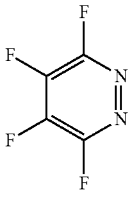 | $C_4F_4N_2$ | 7627-80-7 | |
| 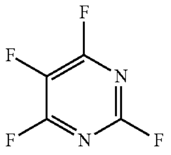 | $C_4F_4N_2$ | 767-79-3 | 83° C. |
| 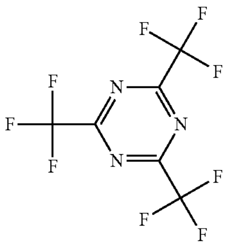 [SMILES: FC(F)(F)c1nc(C(F)(F)F)nc(C(F)(F)F)n1] | $C_6F_9N_3$ | 368-66-1 | 98.3-98.5° C. @ 748 mmHg |
| 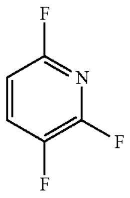 | $C_5H_2F_3N$ | 3512-18-3 | 100-102° C. |
| 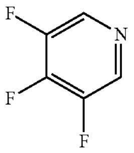 | $C_5H_2F_3N$ | 67815-54-7 | 85-87° C. |
| 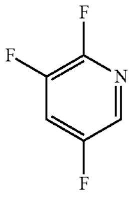 | $C_5H_2F_3N$ | 76469-41-5 | 102° C. |
| 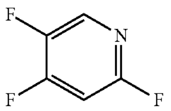 | $C_5H_2F_3N$ | 837365-04-5 | |

TABLE 1-continued
| Mol. Structure | Mol. Formula | CAS No. | Boiling Point |
|---|---|---|---|
| 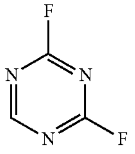 | $C_3HF_2N_3$ | 1207861-13-9 | |
| 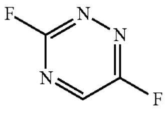 | $C_3HF_2N_3$ | 919785-60-7 | |
| 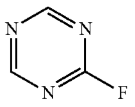 | $C_3H_2FN_3$ | 96100-45-7 | |
| 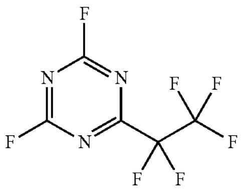 [SMILES: Fc1nc(F)nc(C(F)(F)C(F)(F)F)n1] | $C_5F_7N_3$ | 714-56-7 | |
| 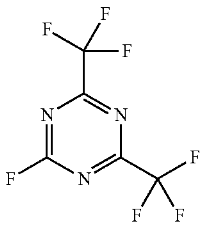 [SMILES: Fc1nc(C(F)(F)F)nc(C(F)(F)F)n1] | $C_5F_7N_3$ | 717-62-4 | |
| 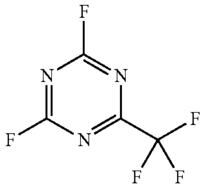 [SMILES: Fc1nc(F)nc(C(F)(F)F)n1] | $C_4F_5N_3$ | 368-55-8 | |
| 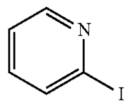 | $C_5H_4NI$ | 5029-67-4 | 93° C. @ 13 Torr Melting point (MP): 118° C. |
| 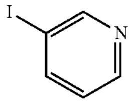 | $C_5H_4NI$ | 1120-90-7 | 4° C. @ 2.03 Torr MP: 53° C. |
| 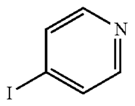 | $C_5H_4NI$ | 15854-87-2 | MP: 106-108° C. |
| 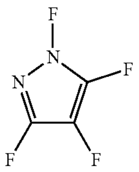 | $C_3F_4N_2$ | 478693-82-2 | |

TABLE 1-continued
| Mol. Structure | Mol. Formula | CAS No. | Boiling Point |
|---|---|---|---|
| 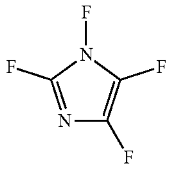 | $C_3F_4N_2$ | 478693-82-1 | |
| 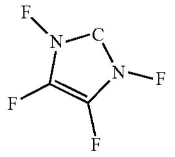 | $C_3F_4N_2$ | 442872-78-8 | |
| 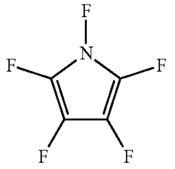 | $C_4NF_5$ | 445235-48-3 | |
| 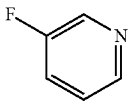 | $C_5H_4FN$ | 372-47-4 | 107.5° C. |
| 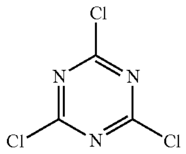 | $C_3Cl_3N_3$ | 108-77-0 | 144-148° C. |
| 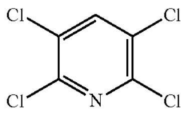 | $C_5HCl_4N$ | 2402-79-1 | 250-252° C. |
| 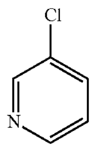 | $C_5H_4ClN$ | 626-60-8 | 147-149° C. |
| 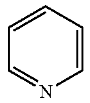 | $C_5H_5N$ | 110-86-1 | 114-115° C. |
| 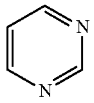 | $C_4H_4N_2$ | 289-95-2 | 123-124° C. |
| 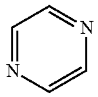 | $C_4H_4N_2$ | 290-37-9 | 115-116° C. |
| 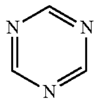 | $C_3H_3N_3$ | 290-87-9 | 114-115° C. |

TABLE 1-continued
| Mol. Structure | Mol. Formula | CAS No. | Boiling Point |
|---|---|---|---|
| 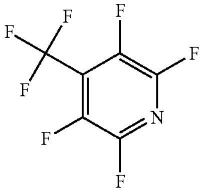 [SMILES: Fc1nc(F)c(F)c(C(F)(F)F)c1F] | $C_6F_7N$ | 3244-44-8 | 132.7° C. |
| 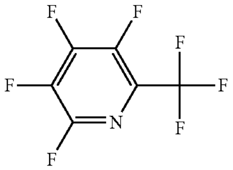 [SMILES: Fc1nc(C(F)(F)F)c(F)c(F)c1F] | $C_6F_7N$ | 3146-94-9 | 103.5-105.0° C. |
| 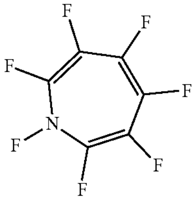 [SMILES: FC1=C(F)C(F)=C(F)N(F)C(F)=C1F] | $C_6F_7N$ | 440367-82-8 | |
| 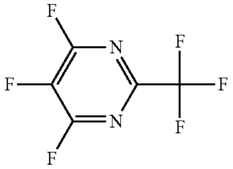 [SMILES: Fc1nc(C(F)(F)F)nc(F)c1F] | $C_5F_6N_2$ | 27077-33-4 | |
| 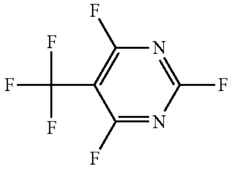 [SMILES: Fc1nc(F)c(C(F)(F)F)c(F)n1] | $C_5F_6N_2$ | 27077-34-5 | 96° C. |
| 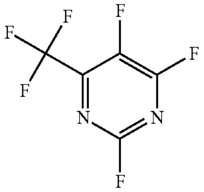 [SMILES: Fc1nc(F)c(F)c(C(F)(F)F)n1] | $C_5F_6N_2$ | 27077-35-6 | |
| 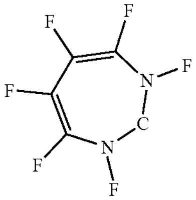 [SMILES: FC1=C(F)N(F)CN(F)C(F)=C1F] | $C_5F_6N_2$ | 442872-68-6 | |
| 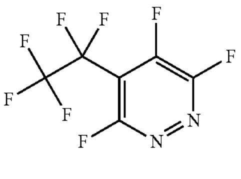 [SMILES: Fc1nnc(F)c(C(F)(F)C(F)(F)F)c1F] | $C_6F_8N_2$ | 49616-39-9 | |

TABLE 1-continued
| Mol. Structure | Mol. Formula | CAS No. | Boiling Point |
|---|---|---|---|
| 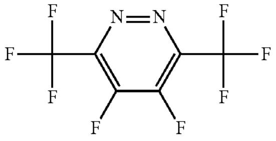 [SMILES: Fc1c(C(F)(F)F)nnc(C(F)(F)F)c1F] | $C_6F_8N_2$ | 67096-98-4 | |
| 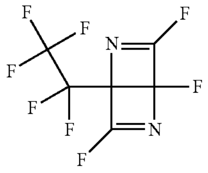 [SMILES: FC1=NC2(C(F)(F)C(F)(F)F)C(F)=NC12F] | $C_6F_8N_2$ | 57684-66-9 | |
| 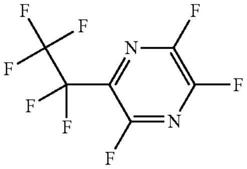 [SMILES: Fc1nc(F)c(C(F)(F)C(F)(F)F)nc1F] | $C_6F_8N_2$ | 55827-93-5 | |
| 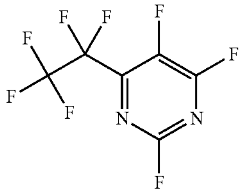 [SMILES: Fc1nc(F)c(F)c(C(F)(F)C(F)(F)F)n1] | $C_6F_8N_2$ | 54415-66-6 | |
| 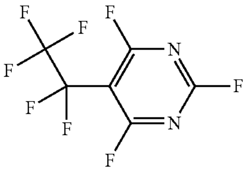 [SMILES: Fc1nc(F)c(C(F)(F)C(F)(F)F)c(F)n1] | $C_6F_8N_2$ | 54415-65-5 | |
| 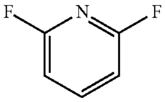 | $C_5H_3F_2N$ | 1513-65-1 | 125° C. |
| 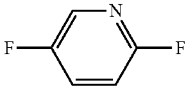 | $C_5H_3F_2N$ | 84476-99-3 | 113-115° C. |
| 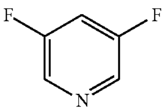 | $C_5H_3F_2N$ | 71902-33-5 | 92.5° C. |
| 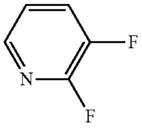 | $C_5H_3F_2N$ | 1513-66-2 | 118° C. |
| 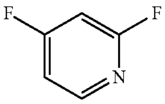 | $C_5H_3F_2N$ | 34941-90-7 | 104-106° C. |

TABLE 1-continued
| Mol. Structure | Mol. Formula | CAS No. | Boiling Point |
|---|---|---|---|
| 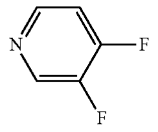 | $C_5H_3F_2N$ | 82878-63-5 | 101-103° C. |
| 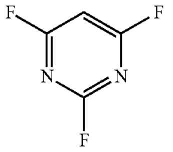 | $C_4HF_3N_2$ | 696-82-2 | 98° C. |
| 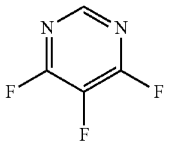 | $C_4HF_3N_2$ | 17573-78-3 | |
| 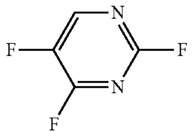 | $C_4HF_3N_2$ | 17573-79-4 | 88-91° C. @ 23 torr |
| 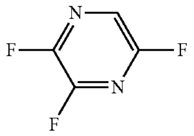 | $C_4HF_3N_2$ | 55215-60-6 | |
| 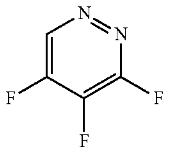 | $C_4HF_3N_2$ | 103526-69-8 | |
| 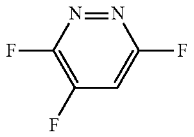 | $C_4HF_3N_2$ | 2386912-84-9 | |
| 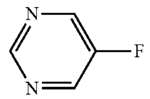 | $C_4H_3FN_2$ | 675-21-8 | |
| 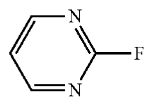 | $C_4H_3FN_2$ | 31575-35-6 | 75° C. @ 20 mmHg |
| 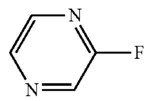 | $C_4H_3FN_2$ | 4949-13-7 | |
| 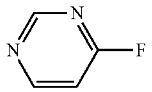 | $C_4H_3FN_2$ | 31462-55-2 | |
| 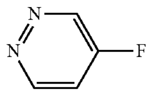 | $C_4H_3FN_2$ | 157496-33-8 | |

TABLE 1-continued

| Mol. Structure | Mol. Formula | CAS No. | Boiling Point |
|---|---|---|---|
| 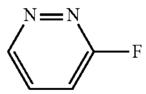 | $C_4H_3FN_2$ | 157496-32-7 | |
| 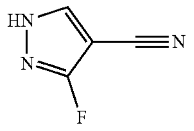 | $C_4H_2FN_3$ | 2169434-14-2 | |
| 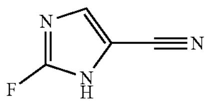 | $C_4H_2FN_3$ | 2116289-91-7 | |

The molecules identified in the Table 1 are novel for their use as an etching gas or an additive and have not been mentioned in any identified references for using as an etching gas or an additive. U.S. Pat. No. 6,508,948 discloses aromatic N-containing molecules but all molecules listed do not contain hydrogen. The molecules in Table 1 containing hydrogen are considered advantageous for applications requiring etch of SiN films such as HAR etch of ONON channels for 3D NAND application. In this regard, the N-containing molecules may support the tuning of the SiO and SiN etching rate which may help provide a smooth sidewall and less scalloping. In addition, U.S. Pat. No. 6,508,948 does not give a formula for these molecules, just the general term perfluorinated heteroaromatic amines, and use the term hydrocarbons that means containing hydrogen. It has not been mentioned in the art that these molecules may produce highly conductive sidewall polymers. U.S. Pat. No. 6,508,948 does not disclose use of Kr or Xe.

The addition of hydrogen into the structure of the molecules is well known to enhance the etch rate of SiN which can be critical for 3D NAND etching of alternating layers of SiO and SiN. However, the addition of H may play two roles. This may be important to control the etching rate of SiO and SiN to prevent scalloping in the sidewall of a HAR structure in ONON 3DNAND etching application. As such controlling the etching rate of each material is critical. A material that etches one material faster than the other could be used as a tuning gas to increase or decrease the etch rate of one material to result in a smoother sidewall.

In addition, specifically, some of the exemplary N-containing aromatic molecules without containing H listed in Table 1 may be used as an additive are shown in Table 2, which shows the permutations of —F to —$CF_3$ substitution and —C to —N substitution.

TABLE 2

| | | —F to —$CF_3$ substitution → | | | |
|---|---|---|---|---|---|
| | | no —$CF_3$ terminal | —$CF_3$ | —$(CF_3)_2$ | —$(CF_3)_3$ |
| —C to —N substitution → | —$N_1$ | $C_5F_5N$ | $C_6F_7N$ | | |
| | —$N_2$ | $C_4F_4N_2$ | $C_5F_6N_2$ | $C_6F_8N_2$ | |
| | —$N_3$ | $C_3F_3N_3$ | $C_4F_5N_3$ | $C_5F_7N_3$ | $C_6F_9N_3$ |
| | | | $C_5F_7N_3$ | $C_6F_9N_3$ | |

Specifically, some of the exemplary N-containing aromatic molecules containing H listed in Table 1 that may be used as an additive are shown in Table 3, which shows the permutations of —F to —H substitution and —C to —N substitution.

TABLE 3

| | | —F to —H substitution → | | | |
|---|---|---|---|---|---|
| | | —H | —$H_2$ | —$H_3$ | —$H_4$ |
| —C to —N substitution → | —$N_1$ | $C_5HF_4N$ | $C_5H_2F_3N$ | $C_5H_3F_2N$ | $C_5H_4FN$ |
| | —$N_2$ | $C_4HF_3N_2$ | $C_5H_2F_2N_2$ | $C_4H_3FN_2$ | $C_4H_4N_2$ |
| | —$N_3$ | $C_3HF_2N_3$ | $C_4H_2FN_3$ | $C_3H_3N_3$ | |

The disclosed new etching and deposition materials maybe used as the additive are suitable to engineer the passivation layer property formed on sidewalls of the HAR holes/trenches. The sidewall passivation and downward etch occur simultaneously. The passivation layer may be formed from the carbon source in plasma etching gas, from the reactions between etching gases and the materials being exposed, or from the redeposition of byproduct from the etch process. The additives to the etchant strongly affect the chemical composition of the sidewall passivation by introducing conductive elements and/or chemical bonds, thereby positively affect the conductivity of the sidewall passivation. Over the course of plasma etching, the potential of the bottom of an etched structure charges positively while the sidewalls charge negatively, thereby building undesired local electrical fields within the etched structure. Only energetic ions with energy larger than the potential difference along a local electrical field may reach to bottom. Charges on the sidewall dissipates fast as conductivity of sidewall passivation increases. The required bias power is below a baseline process.

The disclosed etching gases may be fluorocarbons/hydrofluorocarbons. Exemplary disclosed fluorocarbons/hydrofluorocarbons include $C_4F_6$, $C_4F_8$, $C_4H_2F_6$, $CHF_3$, $CH_2F_2$, $CH_3F$, $CF_4$, $C_2F_6$, $C_3F_8$, $SF_6$, $NF_3$, $C_2F_4$, $C_3F_6$, $C_4F_{10}$, $C_5F_8$, $C_6F_6$, $C_1$-$C_6$ $C_xF_y$ molecules (x and y are integers), $C_2H_5F$, $C_3H_7F$, $C_3H_2F_6$, $C_2HF_5$, or combination thereof. The disclosed fluorocarbons/hydrofluorocarbons etching gases are suitable for etching silicon-containing films that include a layer of silicon oxide (SiO), silicon nitride (SiN), pure silicon (Si) such as crystalline Si, poly-silicon (p-Si or polycrystalline Si); amorphous silicon, low-k SiCOH, SiOCN, SiC, SiON, $Si_aO_bH_cC_dN_e$, where a>0; b, c, d and e≥0; metal containing films (e.g., copper, cobalt, ruthenium, tungsten, indium, platinum, palladium, nickel, ruthenium, gold, etc.), or the like. The silicon-containing film may also include alternating SiO and SiN (ONON) layers or SiO and p-Si (OPOP) layers. The silicon-containing films contain O and/or N. The silicon-containing films may also include dopants, such as B, C, P, As, Ga, In, Sn, Sb, Bi and/or Ge, and combinations thereof. The disclosed etching gas may be other etching gas such as HBr, HCl, HI, HF, or $H_2$.

The disclosed new etching and deposition materials used as the additive and the disclosed fluorocarbons/hydrofluorocarbon etching gases are provided at greater than 95% v/v purity, preferably at greater than 99.99% v/v purity, and more preferably at greater than 99.999% v/v purity.

The disclosed new etching and deposition materials used as the additive and the disclosed fluorocarbons/hydrofluorocarbon etching gases contain less than 1% by volume trace gaseous impurities, with less than 150 ppm by volume of impurity gases, such as $N_2$ and/or $H_2O$ and/or $CO_2$, contained in said trace gaseous impurities. Preferably, the water content in the additive is less than 20 ppmw by weight. The purified additive product may be produced by distillation and/or passing the gas or liquid through a suitable adsorbent, such as a 4 Å molecular sieve.

The disclosed new etching and deposition materials used as the additive and the disclosed fluorocarbons/hydrofluorocarbon etching gases contain less than 10% v/v, preferably less than 1% v/v, more preferably less than 0.1% v/v, and even more preferably less than 0.01% v/v of any of its isomers, which may be purified by distillation of the gas or liquid to remove isomers and may provide better process repeatability.

The disclosed new etching and deposition materials used as the additive and/or the disclosed fluorocarbons/hydrofluorocarbon etching gases selectively etch the silicon-containing layers from a buried landing layer or material which is a metal layer located at the bottom of the structure to be etched in most applications. The disclosed fluorocarbons/hydrofluorocarbons do not etch metal landing layers. The buried landing layer may be an etching stop layer or a diffusion barrier layer. Materials of the metal landing layers may be a tungsten metal worldline in a 3D NAND structure and/or another metal such as W, Cu, Al, Ru, Pt, Ti, Ta, Ni, Co, Mo, Mn, Pd, Ir, Nb, Cr, Rh, V, Au, Ag or combination thereof and/or etch stop layers such as metals or metal oxides or nitrides layer such as AlO, WO, HfO, TiO, TaO, InO, CrO, RuO, CoO, MoO, ZrO, SnO TiN, TaN, HfN, AlN, WN, MON, NIN, NbN, CrN, RuN, CON, ZrN, SnN or combination thereof etc.

The disclosed new etching and deposition materials used as the additive and/or the disclosed etching gases such as fluorocarbons/hydrofluorocarbon may be used to plasma etch silicon-containing films on a substrate. The disclosed plasma etching method may be useful in the manufacture of semiconductor devices such as NAND or 3D NAND gates or Flash or DRAM memory or transistors such as fin-shaped field-effect transistor (FinFET), Gate All Around (GAA)-FET, Nanowire-FET, Nanosheet-FET, Forksheet-FET, Complementary FET (CFET), Bulk complementary metal-oxide-semiconductor (Bulk CMOS), MOSFET, fully depleted silicon-on-insulator (FD-SOI) structures. The disclosed new etching and deposition materials used as the additive and/or the disclosed etching gases such as fluorocarbons/hydrofluorocarbon may be used in other areas of applications, such as different front end of the line (FEOL) and back end of the line (BEOL) etch applications. Additionally, the disclosed new etching and deposition materials used as the additive and/or the disclosed etching gases such as fluorocarbons/hydrofluorocarbon may also be used for etching Si in 3D through silicon via (TSV) etch applications for interconnecting memory to logic on a substrate and in MEMS applications.

The disclosed etching method includes providing a reaction chamber having a substrate disposed therein. The reaction chamber may be any enclosure or chamber within a device in which etching methods take place such as, and without limitation, reactive ion etching (RIE), CCP with single or multiple frequency RF sources, inductively coupled plasma (ICP), or microwave plasma reactors, or other types of etching systems capable of selectively removing a portion of the silicon-containing film or generating active species or depositing films. Preferred chamber is a CCP chamber. One of ordinary skill in the art will recognize that the different plasma reaction chamber designs provide different electron temperature control. Suitable commercially available plasma reaction chambers include but are not limited to the Lam Research Dual CCP reactive ion etcher Dielectric etch product family sold under the trademark Flex™ or the Tokyo Electron Tactras™ or Episode™ UL. The RF power in such may be pulsed to control plasma properties and thereby improving the etch performance (selectivity and damage) further.

The reaction chamber may contain one or more than one substrate. For example, the reaction chamber may contain from 1 to 200 silicon wafers having from 25.4 mm to 450 mm diameters. The substrates may be any suitable substrates used in semiconductor, photovoltaic, flat panel or LCD-TFT device manufacturing. Examples of suitable substrates include wafers, such as silicon, silica, glass, Ge, SiGe, GeSn, InGaAs, GaSb, InP, or GaAs wafers. The wafer will have multiple films or layers on it from previous manufacturing steps, including silicon-containing films or layers. The layers may or may not be patterned. Examples of suitable layers include without limitation silicon (such as amorphous silicon, p-Si, crystalline silicon, any of which may further be p-doped or n-doped with B, C, P, As, Ga, In, Sn, Sb, Bi and/or Ge), silica, silicon nitride, silicon oxide, silicon oxynitride, $Si_aO_bH_cC_dN_e$, (wherein a>0; b, c, d, e≥0), Ge, SiGe, GeSn, InGaAs, GaSb, InP; mask layer materials such as amorphous carbon with or without dopants, antireflective coatings, photoresist materials, a metal oxide, such as AlO, TiO, HfO, ZrO, SnO, TaO etc. or a metal nitride layer such as AlN, ZrN, SnN, HfN, titanium nitride, tantalum nitride etc. or combinations thereof; etch stop layer materials such as silicon nitride, polysilicon, crystalline silicon, silicon carbide, SiON, SiCN or combinations thereof, device channel materials such crystalline silicon, epitaxial silicon, doped silicon, $Si_aO_bH_cC_dN_e$, (wherein a>0; b, c, d, e≥0) or combinations thereof. The silicon oxide layer may form a dielectric material, such as an organic based or silicon oxide based low-k dielectric material (e.g., a porous SiCOH film). An exemplary low-k dielectric material is sold by Applied Materials under the trade name Black Diamond II or III. Additionally, layers comprising tungsten or noble metals (e.g. platinum, palladium, rhodium or gold) may be used. Furthermore, examples of the silicon-containing films may be $Si_aO_bH_cC_dN_e$, (wherein a>0; b, c, d, e≥0). Throughout the specification and claims, the wafer and any associated layers thereon are referred to as substrates.

In the disclosed etching methods, the plasma process time may vary from 0.01 s to 10000 s. Preferably from 1 s to 30 s. $N_2$ purge time may vary from 1 s to 10000 s. Preferably 10 s to 60 s.

The disclosed etching method includes pumping the reactor chamber down to a high vacuum after placing the substrate into the chamber and before introducing the disclosed fluorocarbons/hydrofluorocarbons and/or disclosed new etching and deposition materials into the chamber. The high vacuum may range from 0.01 mTorr-10 mTorr.

The temperature of the reactor chamber may be controlled by either controlling the temperature of the substrate holder or controlling the temperature of the reactor wall. Devices used to heat the substrate are known in the art. The reactor wall is heated to a sufficient temperature to prevent condensation on the wall or the reactor chamber, especially when a shower head reactor is used, in which the substrate temperature is higher than the temperature of the wall. A non-limiting exemplary temperature range to which the reactor wall may be heated includes a range from approximately −100° C. (LN temp) to approximately 500° C., preferably from approximately 20° C. to approximately 150° C., more preferably from 20° C. to approximately 110° C.

The temperature and the pressure within the reaction chamber are held at conditions suitable for the silicon-containing film to react with the activated etching gas or the activated etching components. For instance, The pressure within the reaction chamber are held at conditions suitable for an etchant or a process gas the portions of the substrate not being covered by the patterned mask layer. Here the etchant or the process gas may include a hydrofluorocarbon or fluorocarbon etching gas, an additive, co-reactants, etc. For instance, the pressure in the reactor may be held between approximately 1 mTorr and approximately 100 Torr, preferably between approximately 1 mTorr and approximately 50 Torr, more preferably between approximately 1 mTorr and approximately 10 Torr, even more preferably between approximately 1 mTorr and approximately 50 mTorr, as required by the etching parameters. Likewise, the substrate temperature in the chamber may range between approximately −110° C. to approximately 2000° C., preferably between approximately −70° C. to approximately 1500° C., more preferably between approximately −20° C. to approximately 1000° C., even more preferably between approximately 25° C. to approximately 700° C., even more preferably between approximately 25° C. to approximately 500° C., and even more preferably between approximately 25° C. to approximately 50° C. Chamber wall temperatures may range from approximately 25° C. to approximately 100° C. depending on the process requirements. In a cryogenic etch process the preferred temperature will be less than −20° C.

In one embodiment, each component of the disclosed etching and deposition composition may be introduced to the chamber at a flow rate ranging from approximately 1 sccm to approximately 10 slm. Preferably 1 sccm to 100 sccm. The inert gas may be introduced to the chamber at a flow rate ranging from approximately 1 sccm to approximately 10 slm. Preferably 10 sccm to 200 sccm. One of ordinary skill in the art will recognize that the flow rate may vary from tool to tool.

Etching and deposition conditions may change during the etching process. For example parameters such as gas flow, plasma power, pressure, temperature may be higher or lower during the beginning part of the etch as compared to the end part of the etch near the bottom of the hole or trenches. Alternatively, different etching gases may be added at different points in the etch to improve the performance such as to reduce or enhance the polymer deposition rate.

The disclosed etching and deposition methods provide high selectivity to mask layers, photoresist, etch stop layers and device channel materials and no profile distortion in HAR structures, such as those having an aspect ratio ranging from 1:1 to 500:1 such as DRAM and 3D NAND structures and contact etch applications. The disclosed etching methods are suitable for etching HAR patterned structure having an aspect ratio between approximately 1:1 and approximately 500:1. Alternatively, the disclosed etching methods are suitable for etching HAR patterned structure having an aspect ratio between approximately 1:1 and approximately 200:1, an aspect ratio between approximately 1:1 and approximately 20:1, an aspect ratio between approximately 21:1 and approximately 200:1, an aspect ratio between approximately 1:1 and approximately 60:1, or an aspect ratio between approximately 61:1 and approximately 500:1.

The disclosed etching and deposition methods provide high selectivity of one material vs multiple other materials and could be used for multicolor etching or other selective etching processes whereby etch of one material is highly selective to multiple other materials. This would also enable tuning the etching process for the SiO and SiN etching rate by adding the N-containing gas into an etching gas mixture to prevent scalloping and result in a smooth sidewall.

The disclosed etching and deposition methods comprise the steps of

1) Positioning a patterned substrate with a-C mask on a substrate holder in a plasma processing chamber, such as a CCP plasma etcher;
2) Pumping the processing chamber down to a high vacuum;
3) May or may not introducing an etching gas such as fluorocarbon/fluorohydrocarbon ($C_xH_yF_z$, x, y, z are integers), HBr, HCl, HI, HF, or $H_2$ into the chamber and allowing it to equilibrate;
4) May or may not include introducing an inert gas selected from Ar, Kr, Xe, Ne, $N_2$, He into the chamber and allowing it to equilibrate;
5) Introducing an additive having a general formula of $C_xH_yX_zX'_aN_b$, where x=3-6; y=0-4; z=0-8; a=0-1; b=1-3; X=F, Cl, Br or I (halogens), X'=F, Cl, Br, I (halogens) or CN group, where X≠X', or $C_xH_yF_zI_aN_b$ (wherein x=3-6; y=0-4; z=0-8 a=0-1; b=1-3) into the chamber and allowing it to equilibrate;
6) May or may not include introducing a co-reactant or an oxidizer into the chamber and allowing it to equilibrate;
7) Turning on a source power to ignite plasma;
8) May or may not include turning on a bias power to set plasma bias;
9) Keeping the plasma process running for a specified time; and
10) Turning all plasma source power off.

In the above etching steps, the flow rate of $C_xH_yX_zX'_aN_b$ or $C_xH_yF_zI_aN_b$, inert gas, co-reactant, and other gases such as $C_xH_yF_z$ or other reactants are chosen based on the specific process regime common to the process. The plasma power (bias and source) may be pulsed or continuous. The gas flows may be a continuous flow or a pulsing flow. In addition, a cyclic process could be performed separating the flow of the depositing gas and the co-reactant or inert gas to better control the polymer deposition process and the etching process similar to the concept of atomic layer etching. In the cyclic process, the pressure, flow and plasma configuration for each of the individual steps may be customized for source power, bias power, pulsing or continuous mode.

The co-reactant may be an oxidizer selected from $O_2$, CO, $CO_2$, NO, $NO_2$, $N_2O$, $SO_2$, $H_2S$, or COS or combinations thereof. The vapor of the additive and the co-reactant may be mixed together prior to introduction into the reaction chamber. The oxidizer may comprise between approximately 0.01% v/v to approximately 99.99% v/v of the mixture introduced into the chamber (with 99.99% v/v representing introduction of almost pure oxidizer for the continuous introduction alternative).

Alternatively, the co-reactant may be introduced continuously into the chamber and the vapor of the disclosed additive molecules and the vapor of the fluorocarbon or hydrofluorocarbon etching gas or HBr, HCl, HI, HF, or $H_2$ etching gas may be introduced into the chamber in pulses. The co-reactant may comprise between approximately 0.01% v/v to approximately 99.99% v/v of the mixture introduced into the chamber (with 99.99% v/v representing introduction of almost pure co-reactant for the continuous introduction alternative).

Each component, molecule, gas or vapor in the disclosed etching and deposition methods may be supplied either in a cylinder or in a bubbler with a dip tube. The molecule may be bubbled with an inert gas such as Ar, where the bubbler may be heated and lines may be heated to increase the vapor delivered to the chamber. The bubbler may be located close to the tool to reduce the likelihood of condensation in the line and the pressure drop across long delivery lines. The bubbler may also not have a dip tube and instead use just a vapor draw and sweep gas configuration with an inert gas such as Ar. Other common methods of delivery of low vapor pressure molecules including methods such as vaporizers could be used.

The disclosed additive and etching gas such as fluorocarbon or hydrofluorocarbon etching gases or HBr, HCl, HI, HF, or $H_2$ etching gas may be, respectively, mixed with other gases either prior to introduction into the reaction chamber or inside the reaction chamber. Preferably, the gases may be mixed prior to introduction to the chamber in order to provide a uniform concentration of the entering gas.

The vapor or gas of each component or molecule in the disclosed etching and deposition methods are activated by plasma to produce an activated etching gas. The plasma decomposes the additive, etching gas, oxidizer and inert gas into radical form (i.e., the activated additive, etching gas, oxidizer and inert gas). The plasma may be generated by applying RF or DC power. The plasma may be generated with a RF power ranging from about 25 W to about 100,000 W. The plasma may be generated remotely or within the reactor itself. The plasma may be generated in dual CCP or ICP mode with RF applied at both electrodes. RF frequency of plasma may range from 100 KHz to 1 GHz. Different RF sources at different frequency may be coupled and applied at same electrode. Plasma RF pulsing may be further used to control molecule fragmentation and reaction at substrate. One of skill in the art will recognize methods and apparatus suitable for such plasma treatment.

A quadrupole mass spectrometer (QMS), optical emission spectrometer, FTIR, or other radical/ion measurement tools may measure the activated additive, etching gas, oxidizer and inert gas from the chamber exhaust to determine the types and numbers of species produced. If necessary, the flow rate of the additive, etching gas, oxidizer and/or inert gas may be adjusted to increase or decrease the number of radical species produced.

The disclosed new etching and deposition materials used as the additive and/or the disclosed etching gas such as fluorocarbons/hydrofluorocarbon or HBr, HCl, HI, HF, or $H_2$ etching gases may be mixed with other gases or co-reactants either prior to introduction into the reaction chamber or inside the reaction chamber. Preferably, the gases may be mixed prior to introduction to the chamber in order to provide a uniform concentration of the additive and the entering gas.

In another alternative, the vapor of the disclosed new etching and deposition materials used as the additive and/or the disclosed etching gas such as fluorocarbons/hydrofluorocarbon or HBr, HCl, HI, HF, or $H_2$ etching gases may be, respectively, introduced into the chamber independently from the other gases, such as when two or more of the gases react or are easier to deliver independently.

In the deposition process, the bias power could be set to zero power to allow deposition of a conducting polymer layer but may also be turned to a power greater than zero. A bias power may impact the properties of the resulting deposited film.

A patterned substrate may contain silicon-containing film, a patterned a-C mask layer, an antireflective coating layer, and a photoresist layer may be displaced on top of the silicon-containing film. In the disclosed etching method, the silicon-containing films and the activated etching gas, i.e., the activated additive gas and/or etching gas such as fluorocarbon or hydrofluorocarbon or HBr, HCl, HI, HF, or $H_2$ etching gas, react to form volatile by-products that are removed from the reaction chamber. The patterned a-C mask, antireflective coating, and photoresist layers are less reactive with the activated etching gas. Thus, the activated etching gas selectively reacts with the silicon-containing film to form volatile by-products. The reactions between the silicon-containing film and the activated etching gas result in anisotropic removal of the silicon-containing film from the substrate. Atoms of nitrogen, oxygen, and/or carbon may also be present in the silicon-containing film. The removal is due to a physical sputtering of silicon-containing film from plasma ions (accelerated by the plasma) and/or by chemical reaction of plasma species to convert Si to volatile species, such as $SiF_x$, wherein x ranges from 1-4.

The disclosed etching and deposition method may be applied to etching Si-containing layers, such as alternating layers of different Si materials such as $SiO_2$ and SiN selective vs a mask layer for example a-C or doped a-C, high aspect ratio etching and 3D NAND, deposition of conducting polymer layers, etc.

The disclosed etching and deposition method with the additive produces apertures such as channel holes, gate trenches, staircase contacts, capacitor holes, contact holes, contact etch, slit etch, self-aligned contact, self-aligned vias, super vias etc., in the silicon-containing films. The resulting apertures may have an aspect ratio ranging from approximately 1:1 to approximately 500:1, preferably from approximately 20:1 to approximately 500:1, more preferably from 20:1 to 400:1; and a diameter ranging from approximately 5 nm to approximately 500 nm, preferably less than 100 nm. For example, one of ordinary skill in the art will recognize that a channel hole etch produces apertures in the silicon-containing films having an aspect ratio greater than 50:1.

Typical materials that need to be etched may be SiO. A process of etching SiO may be relevant to etching trenches in Borophosphosilicateglass (BPSG), Tetraethylorthosilicate (TEOS), or low deposition rate TEOS (LDTEOS). An etch stop layer may be silicon nitride or silicon oxygen nitride (SiON) or poly silicon. A mask material used may be a-C, p-Si, or photo resist materials. Herein, the disclosed nitrogen-containing aromatic or ring structure additive etching compounds are applied to etch SiO, SiN, p-Si and/or a-C substrate films.

The disclosed etching and deposition method with the additive may deposit a highly conductive film of thickness ranging from 0.1 nm to 1 micron depending on the application. The deposition method may be used in a cyclic process where the polymer is deposited using the additive gas and an etching step with an etching gas is used to remove material. The material deposited on may be but not limited to a silicon based material or other materials such as carbon, metals, III-V. The deposition method may be used in a cyclic process such as atomic layer etching process or a Bosch etch process. The cyclic etch process may have an inert gas purge step before and after the deposition and etching step. For example, a Bosch etch process for TSV etch application may involve a method of depositing a highly conductive film on a silicon surface, purging the chamber with an inert gas, etching the silicon surface and the conductive film using an etching gas such as $C_4F_8$ and then purging the chamber with an inert gas. This cycle may be repeated until a desired depth of a structure is formed.

In one embodiment, the disclosed deposition method may be applied to deposit a conductive polymer passivation layer on a planar surface or a patterned surface on a substrate. The patterned surface may be sidewalls of an etched structure, such as an aperture, via, hole or trench, in a substrate, in which the etched structure is formed in a film disposed on the substrate and a patterned mask layer disposed on the film. The disclosed deposition method of depositing the conductive polymer passivation layer comprises:

a) exposing the substrate to a vapor of an additive comprising a nitrogen-containing cyclic compound;
b) activating a plasma to produce an activated nitrogen-containing cyclic compound; and
c) forming the conductive polymer passivation layer on the substrate by depositing at least part of the nitrogen-containing cyclic compound thereon, wherein the nitrogen-containing cyclic compound reduces a charge that builds up along the substrate forming the conductive polymer passivation layer thereon, wherein a nitrogen content contained in the conductive polymer layer is greater than 2.5%.

At step a), the substrate may be exposed to a co-reactant or an oxidizer sequentially or simultaneously with the additive. The oxidizer is selected from $O_2$, CO, $CO_2$, NO, $NO_2$, $N_2O$, $SO_2$, $H_2S$, or COS or combinations thereof.

Furthermore, in one embodiment, the disclosed etching and deposition method may be a cyclic etching and deposition method that may be applied to deposit a conductive polymer passivation layer on sidewalls of an etched structure, such as an aperture, via, hole or trench, in a substrate, in which the etched structure is formed in a film disposed on the substrate and a patterned mask layer disposed on the film. The disclosed cyclic etching and deposition method of forming a structure on a substrate comprises:

a) exposing the substrate to a vapor of an additive comprising a nitrogen-containing cyclic compound;
b) activating a plasma to produce an activated nitrogen-containing cyclic compound; and
c) forming the conductive polymer passivation layer on the substrate by depositing at least part of the nitrogen-containing cyclic compound thereon, wherein the nitrogen-containing cyclic compound reduces a charge that builds up along the substrate forming the conductive polymer passivation layer thereon;
d) performing a purging process with an inert gas such as Ar;
e) exposing the substrate to an etching gas such as hydrofluorocarbon or hydrocarbon etching gas, HBr, HCl, HI, HF, or $H_2$, the vapor of the nitrogen-containing cyclic compound, or combinations thereof;
f) activating a plasma to produce an activated etching gas such as hydrofluorocarbon or hydrocarbon etching gas, HBr, HCl, HI, HF, or $H_2$, the activated nitrogen-containing cyclic compound, or combinations thereof;
g) allowing an etching reaction to proceed between the film uncovered by the patterned mask layer and the conductive polymer layer and the activated hydrofluorocarbon or hydrocarbon etching gas, the activated nitrogen-containing cyclic compound, or combination thereof, to selectively etch the film and the conductive polymer layer from the patterned mask layer;
h) performing another purging process with the inert gas such as Ar;
i) repeating steps a) to h), until a desired depth of the structure in the film is formed.

Here note, a purging step using an inert gas such as $N_2$ or Ar may be optionally applied between the exposures at steps a) and e). That is, in some embodiments, step d) and step h) may be eliminated. At step a), the substrate may be exposed to an inert gas, such as Ar, and/or a co-reactant or an oxidizer selected from $O_2$, CO, $CO_2$, NO, $NO_2$, $N_2O$, $SO_2$, $H_2S$, or COS, simultaneously or sequentially with the additive. Then an activated inert gas and/or activated oxidizer are produced if the oxidizer and inert gas are applied. At step e), the substrate may be exposed to an inert gas, such as Ar, and/or a co-reactant or an oxidizer selected from $O_2$, CO, $CO_2$, NO, $NO_2$, $N_2O$, $SO_2$, $H_2S$, or COS, simultaneously or sequentially with the etching gas such as hydrofluorocarbon, hydrocarbon, HBr, HCl, HI, HF, or $H_2$ etching gas and/or the nitrogen-containing cyclic compound. In this case, an activated inert gas and/or an activated co-reactant are then produced if the inert gas and/or the co-reactant are applied. Besides Ar used in the purging process, other inert gas selected from Xe, Kr, Ne, He, $N_2$ or combinations also may be used.

The disclosed method may deposit a high nitrogen content polymer containing C, F, and N and potentially other elements such as O and Si. The nitrogen content is greater than 2.5%. High nitrogen content polymer may be beneficial in HAR etching process. The high nitrogen content polymer may be deposited on the sidewall of the HAR structure during the etching process using the nitrogen containing etching gases.

The disclosed method to etch a HAR structure may use an etching process where the process conditions are changed as the etching is getting deeper and deeper in the structure. For example, the etch recipe may include different process conditions during the etching at the beginning, middle and end corresponding to etching the top, middle and bottom portions of the pattern structure. Accordingly, the disclosed methods may be used to etch only portions of the HAR structure. The disclosed molecules may be used to etch only during the etch of the top, or the middle or the bottom of the pattern structure depending on the etching properties of the etchant or molecule. For example, it may be beneficial to have a highly conductive passivation sidewall polymer when etching the bottom of the structure. It may be beneficial to have a high nitrogen content polymer or plasma during the etch of the top, the middle or the bottom of the pattern structure.

EXAMPLES

The following non-limiting examples are provided to further illustrate embodiments of the invention. However, the examples are not intended to be all inclusive and are not intended to limit the scope of the inventions described herein.

Example 1

FIG. 1 shows $SiO_2$, SiN, p-Si, a-C etch rate and selectivity of $SiO_2$ to a-C mask using $C_5F_5N$, $C_3F_3N_3$ and $C_5HF_4N$, and $C_4F_8$.

Test condition of $C_5F_5N$: 5 sccm of $C_5F_5N$ (CAS No.: 700-16-3), 250 sccm of Ar and varying flow of $O_2$ were flown into a 200 mm dual CCP plasma etch chamber. The plasma power was 750 W/1500 W for 60 s.

Test condition of $C_3F_3N_3$ and $C_5HF_4N$: 15 sccm of etch gas, 150 sccm of Ar and varying flow of $O_2$ were flowed into a 300 mm dual CCP plasma etch chamber. The plasma power was 700 W/6000 W for 60 s.

Test condition of $C_4F_8$: 25 sccm of etch gas, 150 sccm of Ar and varying flow of $O_2$ were flowed into a 300 mm dual CCP plasma etch chamber. The plasma power was 700 W/6000 W for 60 s.

Figure 2:
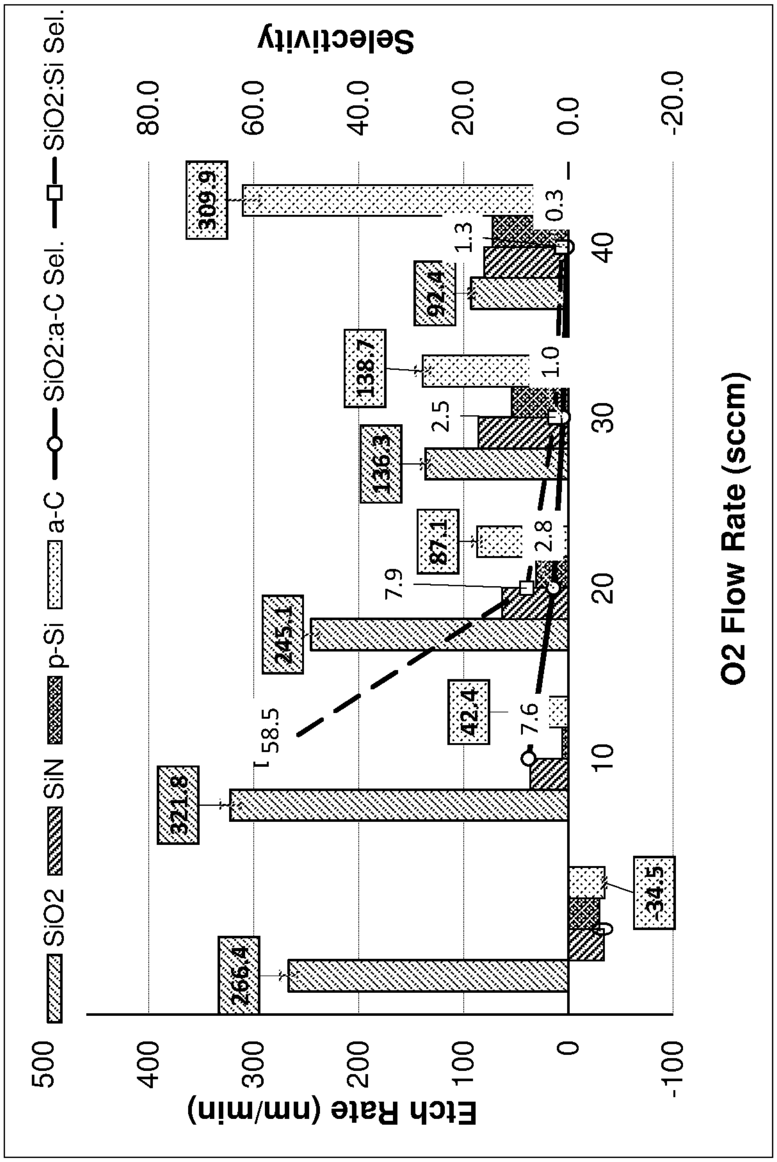
FIG. 2 shows $SiO_2$, SiN, p-Si, a-C etch rate and selectivity of $SiO_2$ to a-C mask of $C_3F_3N_3$.
Figure 3:
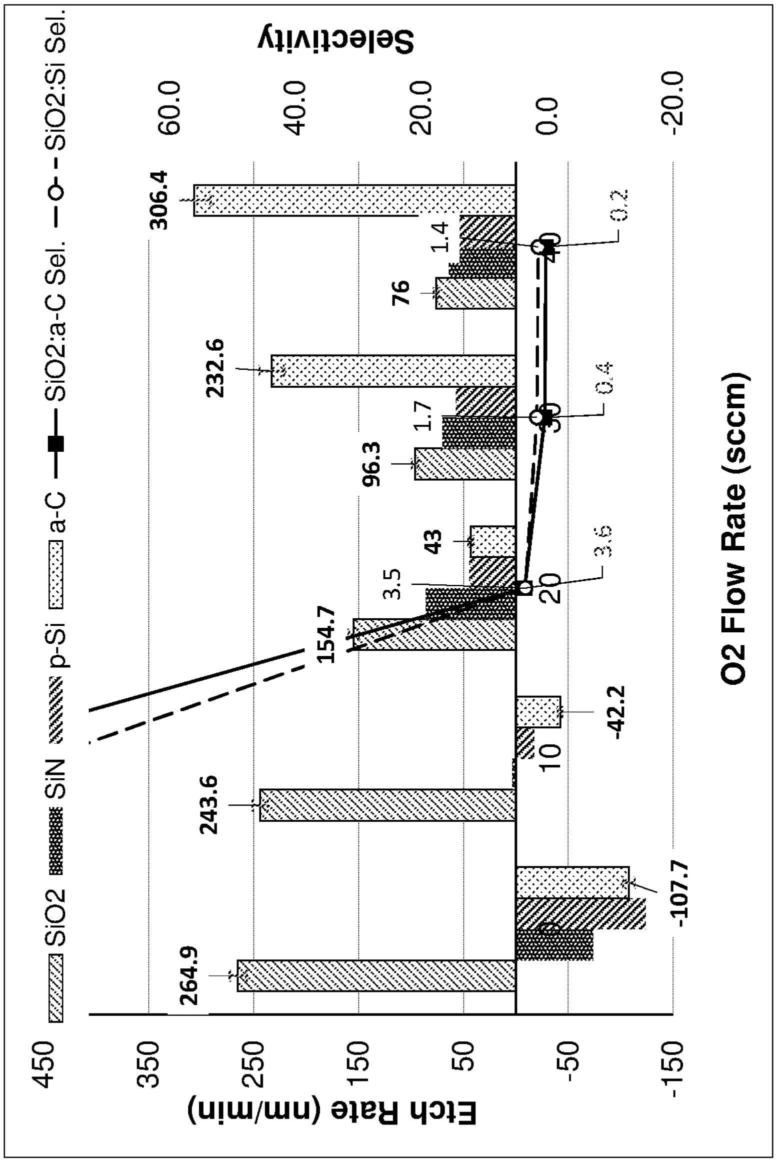
FIG. 3 shows $SiO_2$, SiN, p-Si, a-C etch rate and selectivity of $SiO_2$ to a-C mask of $C_5HF_4N$.

FIG. 2 shows $SiO_2$, SiN, p-Si, a-C etch rate and selectivity of $SiO_2$ to a-C mask of $C_3F_3N_3$. FIG. 3 shows $SiO_2$, SiN, p-Si, a-C etch rate and selectivity of $SiO_2$ to a-C mask of $C_5HF_4N$. Table 4 lists $SiO_2$, SiN, p-Si, a-C etch rate and selectivity of $SiO_2$ to a-C mask of $C_4F_8$. As can be seen from FIG. 2, FIG. 3 and Table 4, $C_5HF_4N$ has very high selectivity of $SiO_2$ vs a-C mask in the process window (Etch gas:$O_2$ ratio is greater than 1), compared to 2 molecules disclosed in U.S. Pat. No. 6,508,948$B_2$, $C_3F_3N_3$ and $C_5F_5N$. It makes the $CHF_4N$ a very desirable molecule for HAR etching of $SiO_2$ material where a-C is the mask material.

TABLE 4

| $O_2$ Flow Rate | Etch Rate | | | | Selectivity | |
|---|---|---|---|---|---|---|
| (sccm) | $SiO_2$ | SiN | p-Si | a-C | $SiO_2$:a-C | $SiO_2$:p-Si |
| 0 | 70.3 | 0 | −40 | −38.4 | | |
| 10 | 56.3 | 40 | 0 | 42.4 | 13.3 | 98.6 |
| 20 | 586.9 | 90 | 30 | 115.5 | 5.1 | 18.4 |
| 30 | 506.6 | 110 | 35 | 128.8 | 3.9 | 15.2 |
| 40 | 381.2 | 160 | 40 | 148.3 | 2.6 | 8.9 |

The trend for $SiO_2$ vs a-C etch selectivity: $C_5HF_4N$>$C_4F_8$>$C_3F_3N_3$. Results suggest $C_5HF_4N$ is more polymerizing than $C_3F_3N_3$ even though their C:F ratio are very similar. Especially at an etch gas vs $O_2$ flow ratio of 1.5, $C_5HF_4N$ demonstrates infinite selectivity of $SiO_2$ to p-Si and a-C thin films but also at a ratio of 0.75 there is an increase in selectivity vs $C_3F_3N_3$ (3.6 vs 2.8). Based on these it may be concluded that the selectivity of $SiO_2$ vs a-C may not be driven by the C:F ratio as demonstrated by the higher selectivity by $C_4F_8$ vs $C_3F_3N_3$. As the results show the N-containing aromatic molecules may be beneficial under certain process conditions such as low-$O_2$ flow rate, to have high selective etch of SiO vs other materials including SiN, p-Si and a-C as compared to $C_4F_8$. But $C_5HF_4N$ shows a wider process window for infinite selectivity of SiO vs other films as compared to $C_3F_3N_3$.

Due to H-containing structure of $C_5HF_4N$, $C_5HF_4N$ should be also a promising candidate for ONON etch. It may be seen that the $SiO_2$:SiN etch rate for $C_5HF_4N$ is closer to 1:1 than for $C_3F_3N_3$ at 20 sccm of $O_2$ where the a-C selectivity is 3.6 vs 2.8 showing a benefit of $C_5HF_4N$ vs $C_3F_3N_3$. Hydrogen is not required to etch SiN as may be seen for $C_4F_8$ and $C_3F_3N_3$ but may enhance the etch rate.

Example 2

Figure 4:
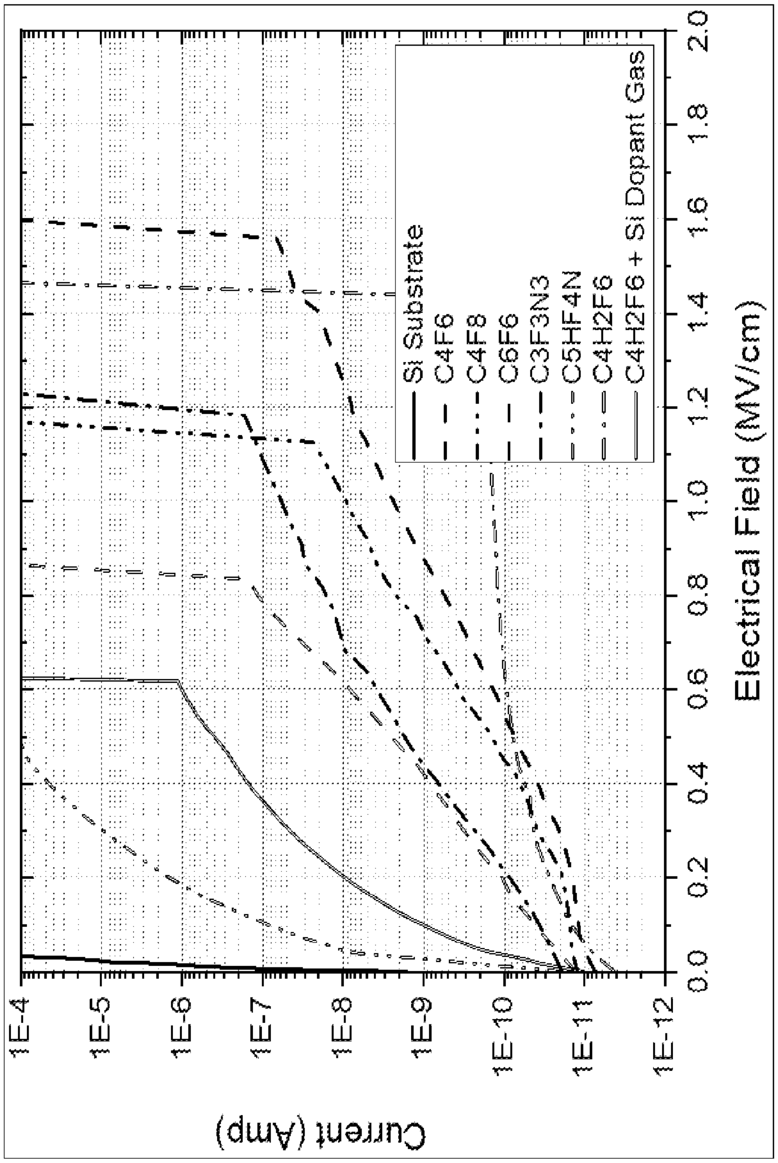
FIG. 4 shows polymer conductivity comparison between $C_5HF_4N$ and molecules known in the art: $C_4F_6$, $C_4F_8$, $C_3F_3N_3$, $C_6F_6$, $C_4H_2F_6$ and a silicon doping gas.

Polymer conductivity comparison between $C_5HF_4N$ and molecules known in the art (US 2019P00634): $C_4F_6$, $C_4F_8$, $C_3F_3N_3$, $C_6F_6$, $C_4H_2F_6$ and a silicon doping gas, is shown in FIG. 4, which is current vs electric field measured using an Hg probe for polymers $C_4F_6$, $C_4F_8$, $C_6F_6$, $C_3F_3N_3$, $C_5HF_4N$. The polymers here ($C_4F_6$, $C_4F_8$, $C_6F_6$, $C_3F_3N_3$, $C_5HF_4N$) are deposited on a bare Si wafer substrate under the same conditions, using the 300 mm dual-frequency CCP etcher. After the deposition, MDC Mercury probe equipped with Keithley 2635 source meter is utilized for I-V measurement. Diameter of the mercury dot is 760 um, which gives a contact area of $4.5*10^{-3}$ $cm^2$. The higher the current shown the I-V plot, the higher conductivity of the surface being analyzed. Table 5 gives the estimated current for the different molecules at an electric field of 0.3 V.

TABLE 5

| Chemistry | Current (A) @ 0.3 V | Aromatic? (Y/N) |
|---|---|---|
| $C_4F_8$ | 4E−11 | N |
| $C_4F_6$ | 2E−11 | N |
| $C_6F_6$ | 3E−10 | Y |
| $C_3F_3N_3$ | 2E−10 | Y |
| $C_4H_2F_6$ | 4E−11 | N |
| $C_4H_2F_6$ + silicon dopant gas | 4E−8 | N |
| $C_5HF_4N$ | 1E−5 | Y |

$C_4F_8$ is a traditional etching gas with all C—C single bonds. $C_4F_6$ has two C═C double bonds. However, the conductivities of $C_4F_8$ and $C_4F_6$ are similar; therefore, $C_4F_8$ and $C_4F_6$ have very little difference in sidewall polymer conductivity and in ability to reduce sidewall charge buildup. Similarly, $C_4H_2F_6$ has one C═C double bond and shows similar conductivity as $C_4F_8$ and $C_4F_6$. $C_6F_6$ is a traditional chemistry but with aromatic C═C structure and it may be seen a 3-10 times improvement in the conductivity of the polymer as compared to molecules without the aromatic structure. $C_3F_3N_3$ also has an aromatic structure and similar conductivity as $C_6F_6$. Thus, the addition of the aromatic structure in the molecules may improve the conductivity of the deposited polymer. However, $C_5HF_4N$ demonstrates a significant increase in the polymer conductivity (>10,000 higher) than the other aromatic molecules.

This is a critical difference showing that the aromatic structure in the molecules alone does not lead to significant increases in polymer conductivity but specific structures, such as $C_5HF_4N$, demonstrated the significant increase in the polymer conductivity. The reason may be due to the C—H bond which may as a reactive site be more able to maintain the pi* bond structure of the aromatic ring in the polymer. In addition, a silicon dopant gas was added to $C_4H_2F_6$ as a comparison and as may be seen while the conductivity does increase significantly as compared to the undoped film the increase in conductivity of the polymer is significantly less than for $C_5HF_4N$.

The increase in conductivity of the polymer created by $C_5HF_4N$ in the plasma is a significant improvement as compared to the molecules known in the art, similar aromatic molecules, as well as polymer doped with a silicon dopant.

Example 3

Figure 5:
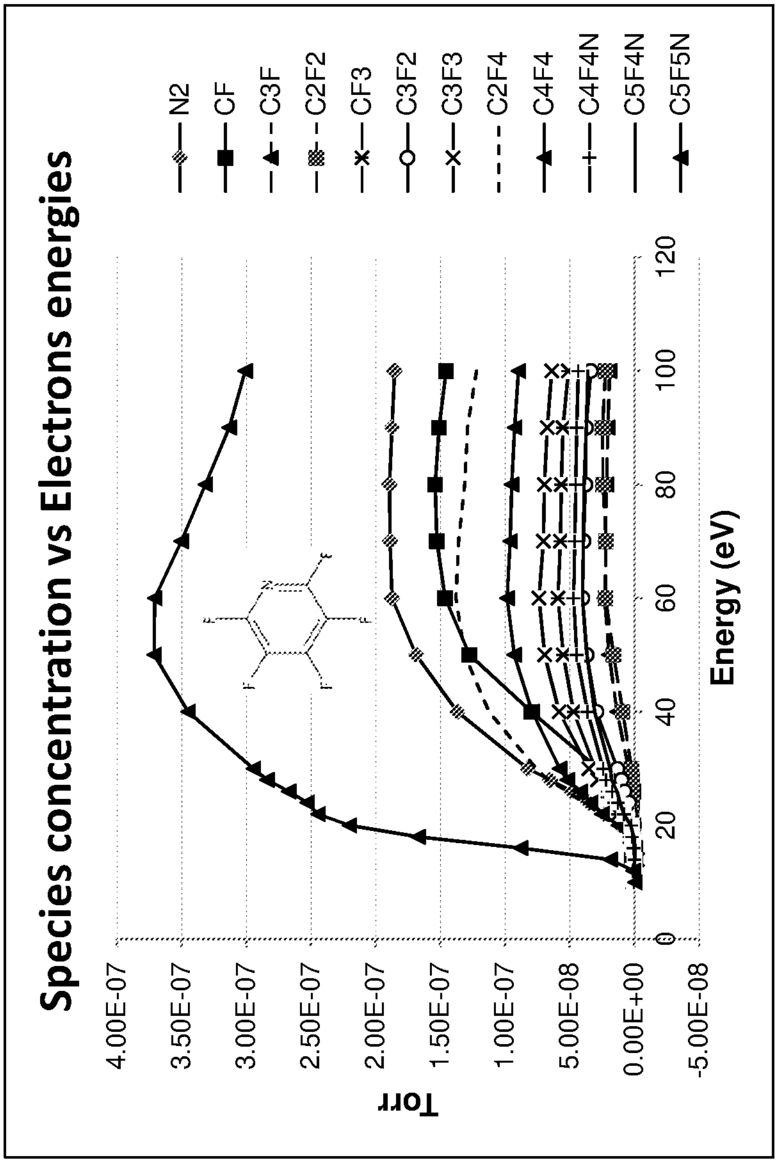
FIG. 5 shows mass spectra of the etch performance of $C_5F_5N$.
Figure 6:
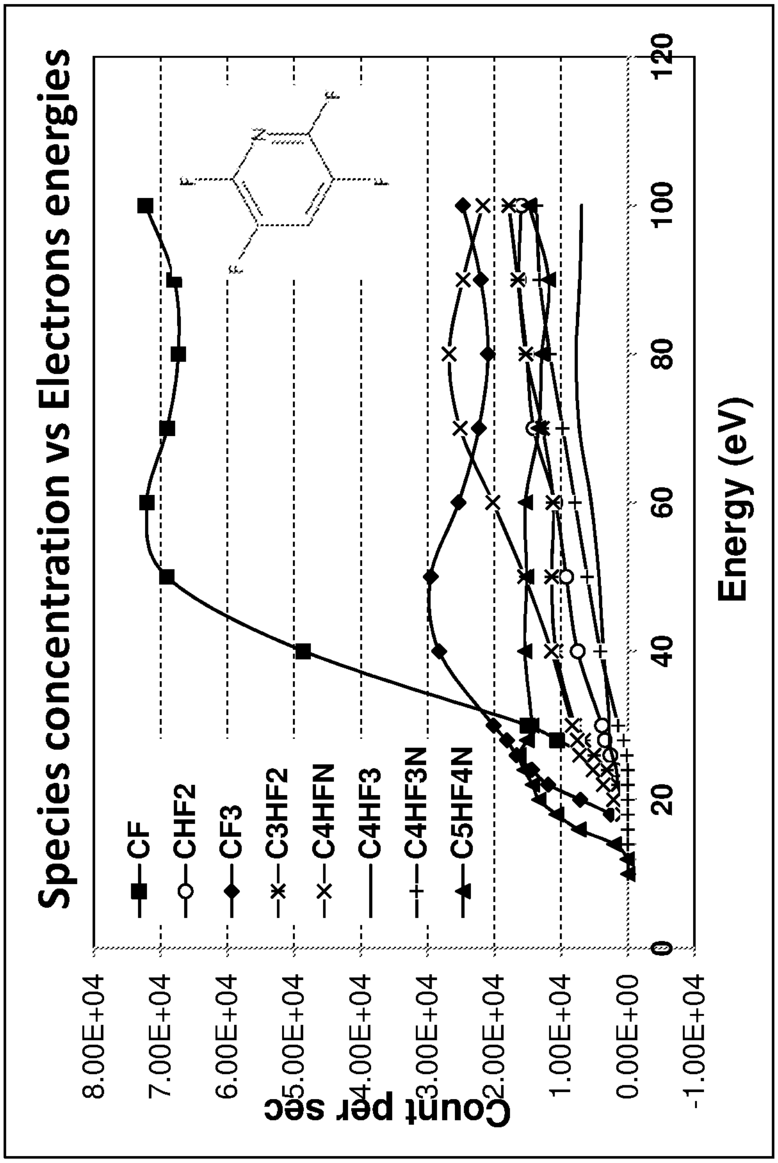
FIG. 6 shows mass spectra of the etch performance of $C_5HF_4N$.

Comparison of the mass spec data of $C_5F_5N$ and $C_5HF_4N$. FIG. 5 and FIG. 6 are mass spec data of $C_5F_5N$ and $C_5HF_4N$.

As can be seen from the mass spec data of $C_5HF_4N$ (FIG. 6) the molecule produces both $CF_3$ etching species as well as CF polymer species and $C_4$ and $C_5$ species including the parent molecule.

$$C_5HF_4N \rightarrow C_4HF_3N\ (0.03) + CF^*$$

$$C_5HF_4N \rightarrow C_4HFN\ (0.09) + CF_3^*$$

Compared to $C_5F_5N$, $C_5HF_4N$ may generate higher concentration of larger fragments, such as $C_4$ and $C_5$ fragments, especially hydrogen containing fragments, which may increase the degree of cross-linking of the polymer formed in the plasma phase and hence makes the polymer more electrically conductive. This property makes $C_5HF_4N$ a desirable molecule to reduce the charge buildup in the high aspect ratio etch process.

Example 4

Comparison of the polymer composition of $C_5HF_4N$ vs a molecule known in the art: $C_4F_6$ using a 300 mm dual CCP plasma etch chamber. Polymer was deposited on a blanket silicon wafer with a flow rate of 5 sccm of $C_5HF_4N$ and 150 sccm of Ar, or 5 sccm of $C_4F_6$ and 150 sccm of Ar. The pressure was 22 mTorr, the RF source power was 950/200 W and the Bias power was 4000/200 W with a duty cycle of 70% and a Frequency of 500 Hz. The thickness of the polymer was ~50 nm for each film. Table 6 shows the composition of the polymer for each as measured using XPS.

TABLE 6

| Gas used | C % | F % | N % | O % | Other % |
|---|---|---|---|---|---|
| $C_4F_6$/Ar | 57 | 35.3 | 0.35 | 4.45 | 2.9 |
| $C_5HF_4N$/Ar | 60.1 | 22.8 | 7.1 | 6.2 | 3.8 |

As can be seen from the XPS results the polymer film deposited using $C_4F_6$ has a C:F ratio of 1.6 and for $C_5HF_4N$ of 2.6. The higher C:F ratio can be beneficial for HAR etch. Also, the $C_5HF_4N$ has a high concentration of nitrogen, ~7.1%. Polymer was also deposited on a blanket Si wafer using $C_3F_3N_3$ and Ar or $C_4F_8$ and Ar in a similar manner on the 300 mm dual CCP plasma etch chamber. The polymer composition by XPS is shown below in Table 7.

TABLE 7

| Gas used | C % | F % | N % | O % | Other % |
|---|---|---|---|---|---|
| $C_4F_8$/Ar | 47.4 | 49.6 | 0 | 3.02 | — |
| $C_3F_3N_3$/Ar | 53.3 | 16.5 | 14.4 | 13.6 | 2.2 |

As can be seen from Table 7 the $C_3F_3N_3$ also gave high nitrogen composition and a higher C:F ratio than $C_4F_8$ of 3.2 vs 0.96 for $C_4F_8$. Both $C_3F_3N_3$ and $C_5HF_4N$ are advantageous to make high nitrogen content fluorocarbon based polymer layers using plasma.

Comparative Example 1

Polymer was deposited on a blanket silicon wafer using $C_3HF_4N$ (CAS No.: 431-32-3) in a 200 mm plasma dual CCP plasma etch tool. XPS analysis of the polymer is shown in Table 8. As can be seen from this comparative data $C_3HF_4N$ does not produce high nitrogen content polymer even though it contains the same number of N atoms per molecule as $C_5HF_4N$.

TABLE 8

| Gas used | C % | F % | N % | O % | Other % |
|---|---|---|---|---|---|
| $C_3HF_4N$/Ar | 71.8 | 24.8 | 2.5 | 0.9 | — |

Although the subject matter described herein may be described in the context of illustrative implementations to process one or more computing application features/operations for a computing application having user-interactive components the subject matter is not limited to these particular embodiments. Rather, the techniques described herein may be applied to any suitable type of user-interactive component execution management methods, systems, platforms, and/or apparatus.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims.

What is claimed is:

1. A method for forming a substantially vertical structure, the method comprising:

exposing a substrate to a vapor of an additive comprising a nitrogen-containing cyclic compound, the substrate having a film disposed thereon and a patterned mask layer disposed on the film;

activating a plasma to produce an activated nitrogen-containing cyclic compound; and allowing an etching reaction to proceed between the film uncovered by the patterned mask layer and the activated nitrogen-containing cyclic compound to selectively etch the film from the patterned mask layer, thereby forming the substantially vertical structure, wherein the nitrogen-containing cyclic compound reduces a charge that builds up along sidewalls of the substantially vertical structure forming a conductive sidewall passivation layer on the sidewalls thereof, wherein the nitrogen-containing cyclic compound has a general formula $C_xH_yX_zX'_aN_b$, where x=3-6; y=0-4; z=0-8; a=0-1; b=1-3; X=F, Cl, Br or I, X'=F, Cl, Br, I or CN group, where X≠X', provided that the nitrogen-containing cyclic compound excludes $C_5F_5N$, $C_3F_4N_2$, $C_4N_2F_4$, $C_4N_2F_4$, $C_3F_3N_3$, $C_4NF_5$, $C_3F_4N_2$, $C_4N_2F_4$, $C_3F_2N_3Cl$, $C_3FN_3Cl_2$, and $C_3N_3Cl_3$.

2. The method of claim 1, further comprising prior to activating the plasma, sequentially or simultaneously exposing the substrate to one or more hydrofluorocarbon or fluorocarbon etching gases with the additive, wherein the one or more hydrofluorocarbon or fluorocarbon etching gases are selected from $C_4H_2F_6$, $CHF_3$, $CH_2F_2$, $CH_3F$, $SF_6$, $NF_3$, $C_2F_4$, $C_xF_y$ molecule (x and y are integers, x=1 to 6), $C_2H_5F$, $C_3H_7F$, $C_3H_2F_6$, $C_2HF_5$, or combination thereof, or HBr, HCl, HI, HF, or $H_2$.

3. The method of claim 1, further comprising prior to activating the plasma, sequentially or simultaneously exposing the substrate to an inert gas with the additive, wherein the inert gas is selected from Ar, Kr, Xe, Ne, $N_2$, He or combination thereof.

4. The method of claim 1, further comprising prior to activating the plasma, sequentially or simultaneously exposing the substrate to a co-reactant with the additive, wherein the co-reactant is selected from $O_2$, CO, $CO_2$, NO, $NO_2$, $N_2O$, $SO_2$, $H_2S$, or COS or combinations thereof.

5. The method of claim 1, wherein the nitrogen-containing cyclic compound contains a cyclic or aromatic structure, at least 1 double C═C bond and at least one nitrogen contained within the cyclic or aromatic structure.

6. The method of claim 1, wherein the nitrogen-containing cyclic compound is selected from $C_5HF_4N$, $C_5F_5N$, $C_3F_3N_3$, $C_3F_3N_3$, $C_3F_3N_3$, $C_4F_4N_2$, $C_4F_4N_2$, $C_4F_4N_2$, $C_6F_9N_3$, $C_5H_2F_3N$, $C_5H_2F_3N$, $C_5H_2F_3N$, $C_5H_2F_3N$, $C_3HF_2N_3$, $C_3HF_2N_3$, $C_5F_7N_3$, $C_4F_5N_3$, $C_5H_4NI$, $C_5H_4NI$, $C_5H_4NI$, $C_3F_4N_2$, $C_3F_4N_2$, $C_3F_4N_2$, $C_4NF_5$, $C_5H_4FN$, $C_3Cl_3N_3$, $C_5HCl_4N$, $C_5H_4ClN$, $C_5H_5N$, $C_4H_4N_2$, $C_4H_4N_2$, $C_3H_3N_3$, $C_6F_7N$, $C_6F_7N$, $C_6F_7N$, $C_5F_6N_2$, $C_5F_6N_2$, $C_5F_6N_2$, $C_5F_6N_2$, $C_6F_8N_2$, $C_6F_8N_2$, $C_6F_8N_2$, $C_6F_8N_2$, $C_6F_8N_2$, $C_6F_8N_2$, $C_5H_3F_2N$, $C_5H_3F_2N$, $C_5H_3F_2N$, $C_5H_3F_2N$, $C_5H_3F_2N$, $C_5H_3F_2N$, $C_4HF_3N_2$, $C_4HF_3N_2$, $C_4HF_3N_2$, $C_4HF_3N_2$, $C_4HF_3N_2$, $C_4HF_3N_2$, $C_4H_3FN_2$, $C_4H_3FN_2$, $C_4H_3FN_2$, $C_4H_3FN_2$, $C_4H_3FN_2$, $C_4H_3FN_2$, $C_4H_2FN_3$, or $C_4H_2FN_3$.

7. The method of claim 1, wherein the nitrogen-containing cyclic compound is $C_5HF_4N$.

8. The method of claim 1, wherein the substantially vertical structure is an aperture, via, hole, or trench formed in the film and has an aspect ratio between approximately 1:1 and approximately 500:1.

9. The method of claim 1, wherein the conductive sidewall passivation layer contains at least C, F, and N.

10. The method of claim 1, wherein a nitrogen content contained in the conductive sidewall passivation layer is greater than 2.5%.

* * * * *